(12) United States Patent
Kang et al.

(10) Patent No.: US 10,784,281 B2
(45) Date of Patent: Sep. 22, 2020

(54) THREE-DIMENSIONAL SEMICONDUCTOR MEMORY DEVICES

(71) Applicant: Samsung Electronics Co., Ltd., Suwon-si, Gyeonggi-do (KR)

(72) Inventors: Joo-Heon Kang, Seoul (KR); Bongtae Park, Seoul (KR); Jae-Joo Shim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/425,349

(22) Filed: May 29, 2019

(65) Prior Publication Data

US 2020/0135756 A1    Apr. 30, 2020

(30) Foreign Application Priority Data

Oct. 26, 2018   (KR) ........................ 10-2018-0128922

(51) Int. Cl.
| | |
|---|---|
| *H01L 27/11582* | (2017.01) |
| *H01L 27/11524* | (2017.01) |
| *H01L 27/11556* | (2017.01) |
| *H01L 21/02* | (2006.01) |
| *H01L 21/311* | (2006.01) |
| *H01L 27/1157* | (2017.01) |

(52) U.S. Cl.
CPC .. *H01L 27/11582* (2013.01); *H01L 21/02063* (2013.01); *H01L 21/31116* (2013.01); *H01L 21/31144* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11524; H01L 27/11556; H01L 21/02063; H01L 21/31116; H01L 21/31144; H01L 27/1157
See application file for complete search history.

(56) References Cited

U.S. PATENT DOCUMENTS

| | | | |
|---|---|---|---|
| 9,524,977 | B2 | 12/2016 | Sharangpani et al. |
| 9,768,266 | B2 | 9/2017 | Seol et al. |
| 9,799,669 | B2 | 10/2017 | Rabkin et al. |
| 9,876,025 | B2 | 1/2018 | Rabkin et al. |
| 9,941,295 | B2 | 4/2018 | Rabkin et al. |

(Continued)

*Primary Examiner* — Julia Slutsker
(74) *Attorney, Agent, or Firm* — Harness, Dickey & Pierce, P.L.C.

(57) ABSTRACT

A 3D semiconductor memory device includes an electrode structure on a substrate, the electrode structure including gate electrodes stacked in a first direction perpendicular to a top surface of the substrate, a vertical semiconductor pattern penetrating the electrode structure and connected to the substrate, and a data storage pattern between the electrode structure and the vertical semiconductor pattern. The data storage pattern includes first, second and third insulating patterns sequentially stacked. Each of the first to third insulating patterns includes a horizontal portion extending in a second direction parallel to the top surface of the substrate. The horizontal portions of the first, second and third insulating patterns are sequentially stacked in the first direction. At least one of the horizontal portions of the first and third insulating patterns protrudes beyond a sidewall of the horizontal portion of the second insulating pattern in the second direction.

20 Claims, 20 Drawing Sheets

(56) References Cited

U.S. PATENT DOCUMENTS

| | | |
|---|---|---|
| 2015/0311301 A1 | 10/2015 | Seol et al. |
| 2017/0263633 A1 | 9/2017 | Ishigaki et al. |
| 2017/0365613 A1 | 12/2017 | Gunji-Yoneoka et al. |
| 2018/0033639 A1 | 2/2018 | Jung et al. |
| 2018/0108416 A1 | 4/2018 | Harari |
| 2018/0108672 A1 | 4/2018 | Choi et al. |
| 2020/0091188 A1* | 3/2020 | Lee .................. H01L 27/11519 |

\* cited by examiner

US 10,784,281 B2

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0128922, filed on Oct. 26, 2018, in the Korean Intellectual Property Office, the disclosure of which is hereby incorporated by reference in its entirety.

BACKGROUND

Embodiments of inventive concepts relate to semiconductor memory devices and, more particularly, to three-dimensional (3D) semiconductor memory devices having three-dimensionally arranged memory cells.

Semiconductor devices have been highly integrated providing excellent performance and low manufacture costs. The integration density of semiconductor devices directly affects the costs of the semiconductor devices, and may result in a demand of highly integrated semiconductor devices. The integration density of typical two-dimensional (2D), e.g. planar, semiconductor devices may be mainly determined by an area where a unit memory cell occupies. Therefore, the integration density of the typical 2D or planar semiconductor devices may be greatly affected by a technique of forming fine patterns. However, since extremely high-priced apparatuses, e.g. immersion lithography and/or extreme ultraviolet lithography (EUV) are needed to form fine patterns, the integration density of 2D semiconductor devices continues to increase, but challenges still remain.

Three-dimensional (3D) semiconductor devices including three-dimensionally arranged memory cells have been developed to overcome at least some of these limitations. However, a cost per bit of 3D semiconductor devices may be expensive as compared with that of 2D semiconductor devices, and thus it is desired to develop process techniques capable of reducing the cost per bit and of improving reliability.

SUMMARY

Embodiments of inventive concepts may provide 3D semiconductor memory devices capable of reducing or minimizing defects.

Embodiments of inventive concepts may also provide 3D semiconductor memory devices capable of simplifying manufacturing processes.

In some example embodiments, a 3D semiconductor memory device may include a substrate, an electrode structure on the substrate, the electrode structure including gate electrodes stacked in a first direction, the first direction perpendicular to a top surface of the substrate, a vertical semiconductor pattern penetrating the electrode structure and connecting to the substrate, and a data storage pattern between the electrode structure and the vertical semiconductor pattern. The data storage pattern includes a first insulating pattern, a second insulating pattern, and a third insulating pattern, the first through third insulating patterns sequentially stacked. Each of the first to third insulating patterns includes a horizontal portion extending in a second direction, the second direction parallel to the top surface of the substrate. The horizontal portion of the first insulating pattern, the horizontal portion of the second insulating pattern, and the horizontal portion of the third insulating pattern are sequentially stacked in the first direction. In the second direction, at least one of the horizontal portion of the first insulating pattern or the horizontal portion of the third insulating pattern protrudes beyond a sidewall of the horizontal portion of the second insulating pattern.

In some example embodiments, a 3D semiconductor memory device may include a substrate, an electrode structure on the substrate, the electrode structure including gate electrodes stacked in a first direction perpendicular to a top surface of the substrate, a vertical semiconductor pattern penetrating the electrode structure and connecting to the substrate, a first insulating pattern extending in the first direction, the first insulating pattern between the electrode structure and the vertical semiconductor pattern, and a second insulating pattern extending in the first direction, the second insulating pattern between the first insulating pattern and the vertical semiconductor pattern. Each of the first and second insulating patterns includes a horizontal portion extending in a second direction, the second direction parallel to the top surface of the substrate. The horizontal portion of the first insulating pattern is between the substrate and the horizontal portion of the second insulating pattern. The horizontal portion of the first insulating pattern protrudes beyond a sidewall of the horizontal portion of the second insulating pattern in the second direction.

BRIEF DESCRIPTION OF THE DRAWINGS

Inventive concepts will become more apparent in view of the attached drawings and accompanying detailed description.

DETAILED DESCRIPTION OF EXAMPLE EMBODIMENTS

Hereinafter, example embodiments of inventive concepts will be described in detail with reference to the accompanying drawings.

Figure 1:
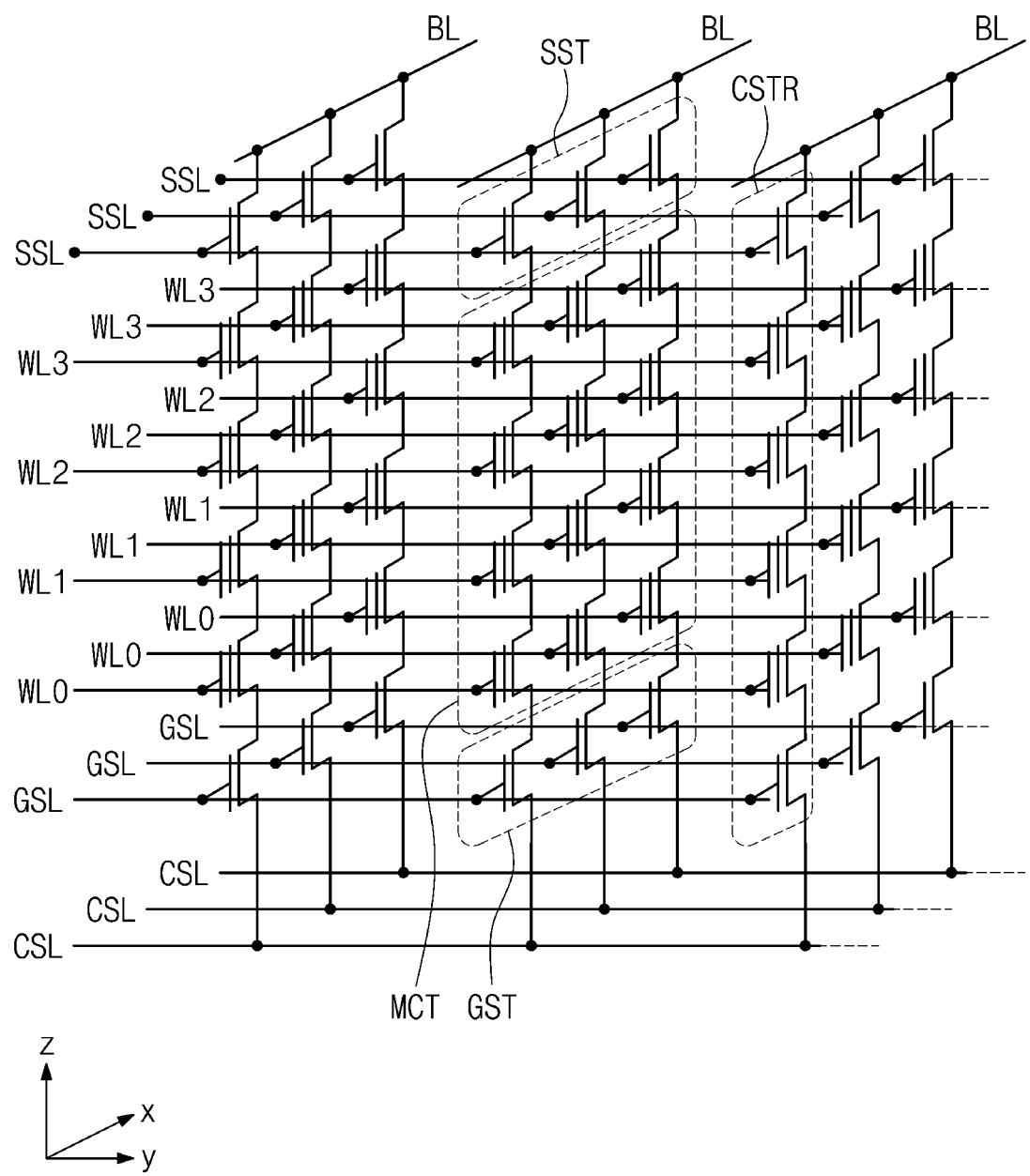
FIG. 1 is a schematic circuit diagram illustrating a cell array of a three-dimensional (3D) semiconductor memory device according to some example embodiments of inventive concepts.

FIG. 1 is a schematic circuit diagram illustrating a cell array of a three-dimensional (3D) semiconductor memory device according to some example embodiments of inventive concepts.

Referring to FIG. 1, a cell array of a 3D semiconductor memory device according to some example embodiments may include a common source line CSL, a plurality of bit lines BL, and a plurality of cell strings CSTR connected between the common source line CSL and the bit lines BL.

The common source line CSL may be or include a conductive layer disposed on a substrate, e.g. a dopant region formed within the substrate. The bit lines BL may be or include conductive patterns (e.g., metal lines) vertically spaced apart from the substrate. The bit lines BL may be two-dimensionally arranged, and a plurality of the cell strings CSTR may be connected in parallel to each of the bit lines BL. The cell strings CSTR may be connected in common to the common source line CSL. For example, the cell strings CSTR may be disposed between one common source line CSL and the bit lines BL. In some example embodiments, the common source line CSL may be provided in plurality, and the plurality of common source lines CSL may be two-dimensionally arranged. Accordingly, the same voltage may be applied to the plurality of common source lines CSL, or alternatively the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other. For example, they may be connected serially in the order of the ground selection transistor GST, the memory cell transistors MCT, and the string selection transistor.

The common source line CSL may be connected in common to sources of the ground selection transistors GST. A ground selection line GSL, a plurality of word lines WL0 to WL3, and a string selection line SSL which are disposed between the common source line CSL and the bit lines BL, may be used as a gate electrode of the ground selection transistor GST, gate electrodes of the memory cell transistors MCT, and a gate electrode of the string selection transistor SST, respectively. Each of the memory cell transistors MCT may include a data storage element.

Figure 2:
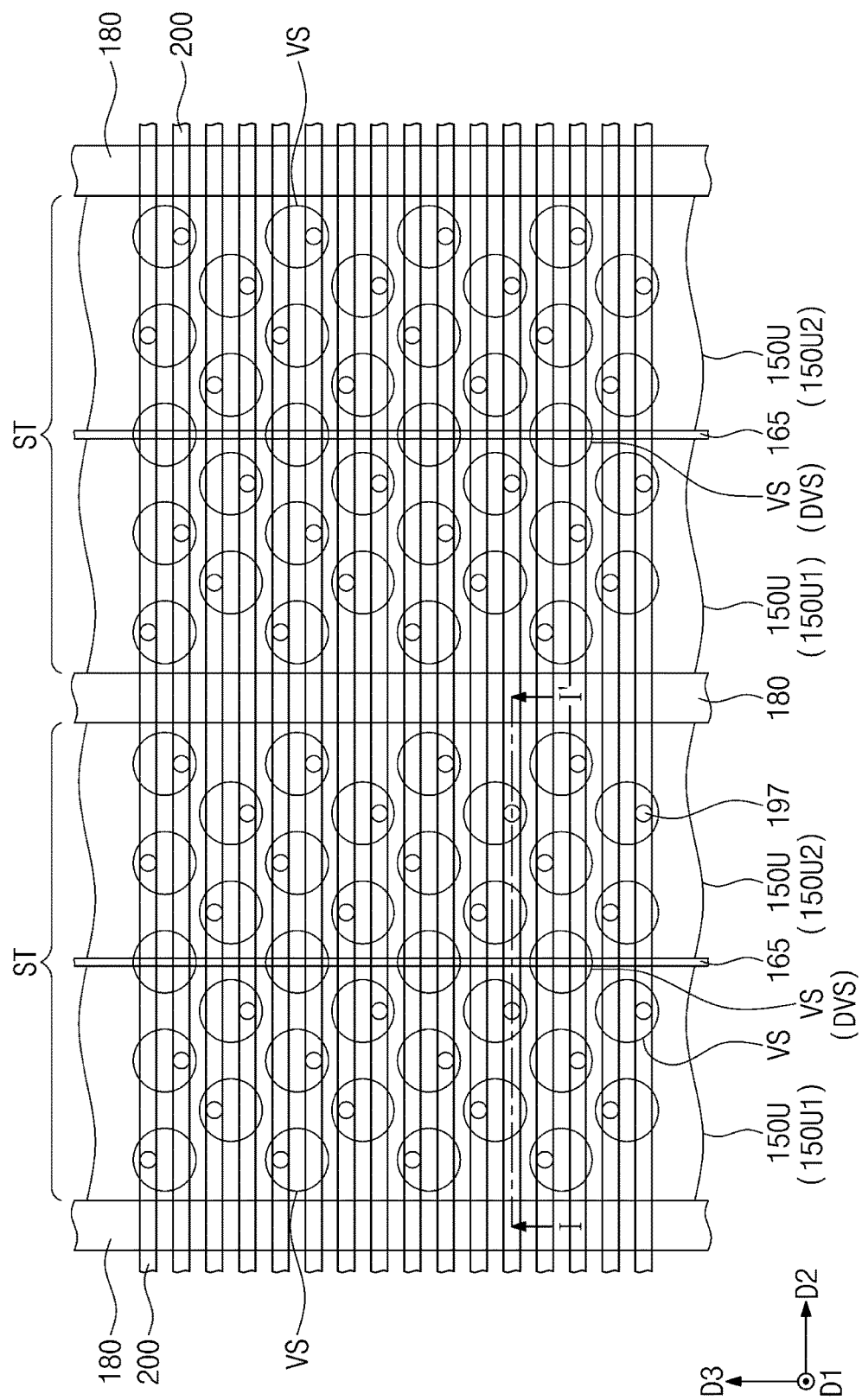
FIG. 2 is a plan view illustrating a 3D semiconductor memory device according to some example embodiments of inventive concepts.
Figure 3:
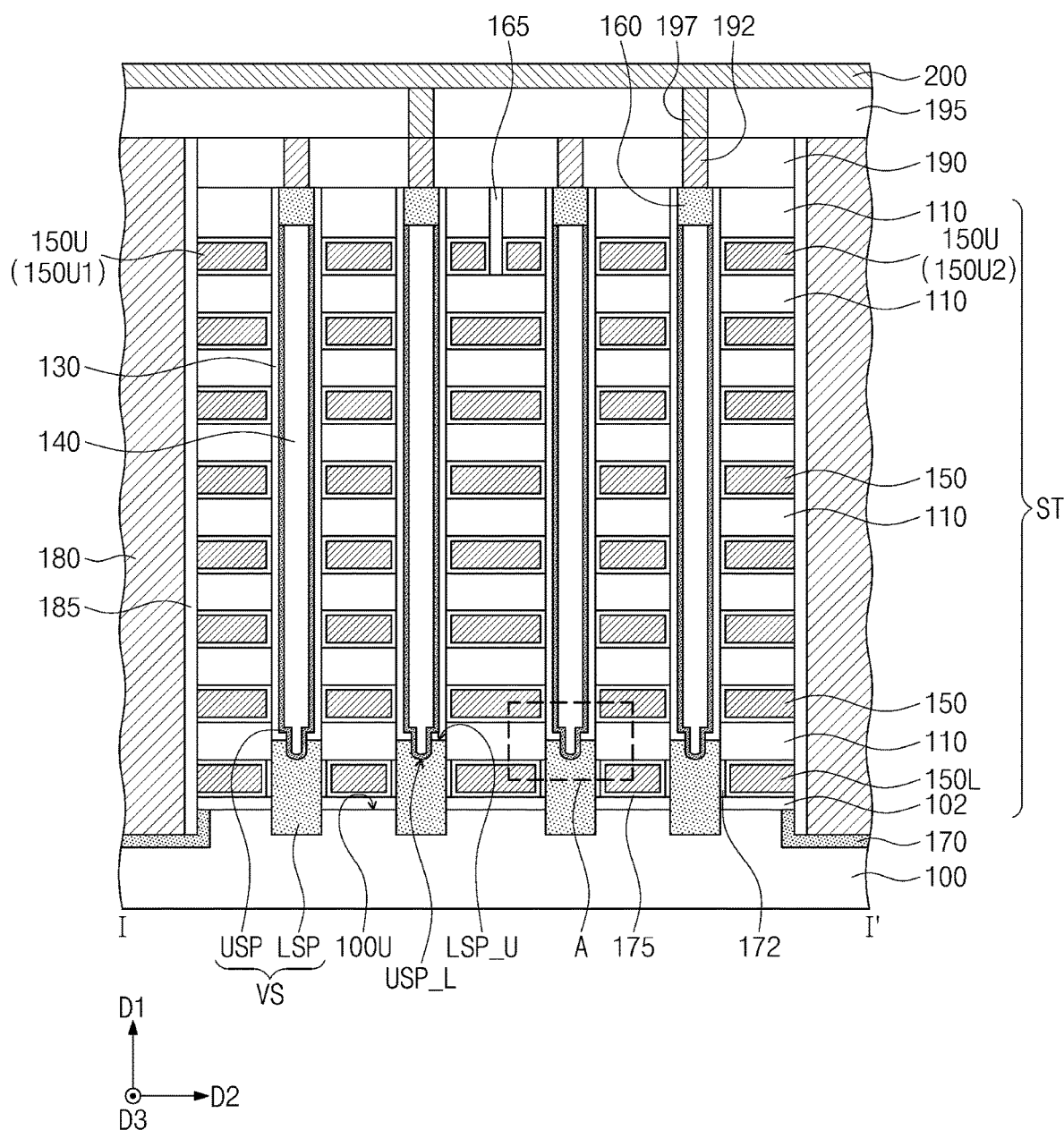
FIG. 3 is a cross-sectional view taken along a line I-I' of FIG. 2.
Figure 4:
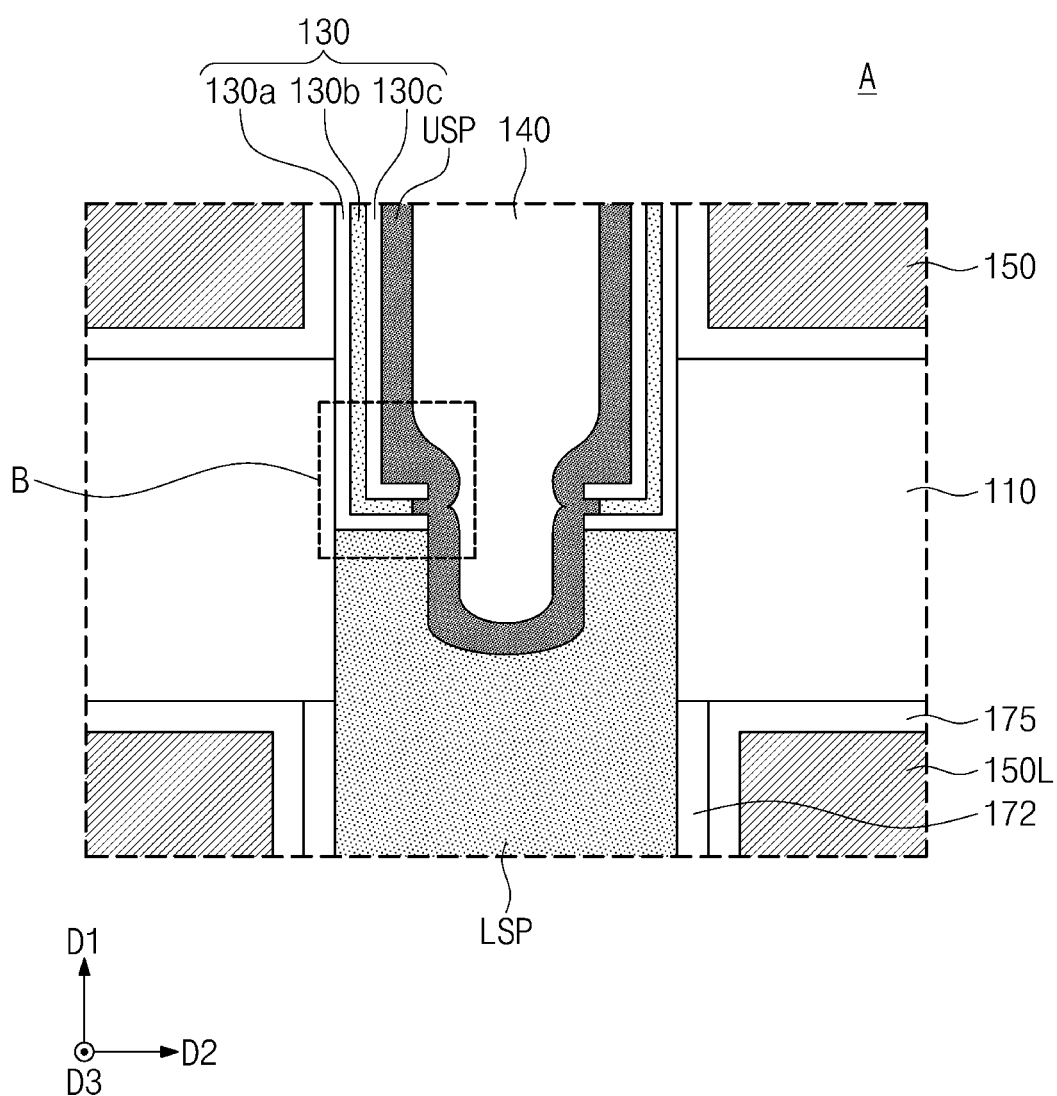
FIG. 4 is an enlarged view of a portion 'A' of FIG. 3.
Figure 5A:
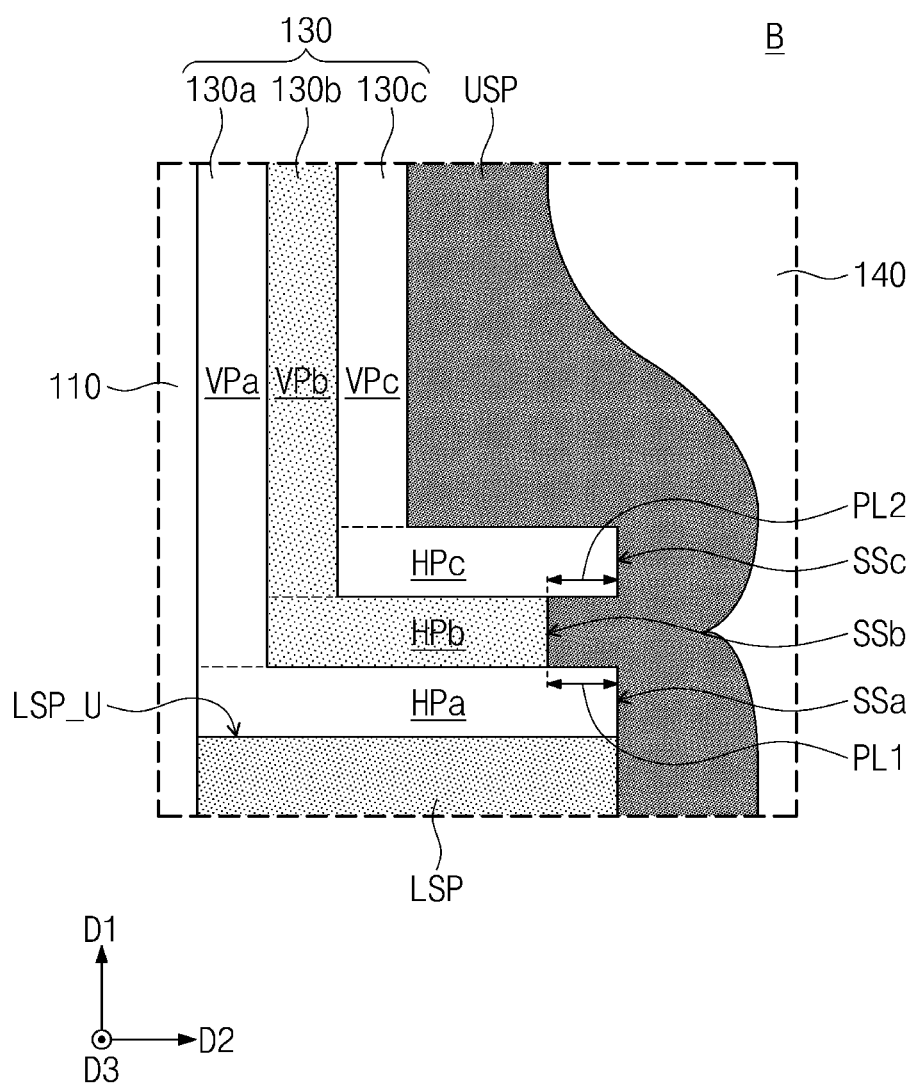
FIG. 5A is an enlarged view of a portion 'B' of FIG. 4.

FIG. 2 is a plan view illustrating a 3D semiconductor memory device according to some example embodiments of inventive concepts. FIG. 3 is a cross-sectional view taken along a line I-I' of FIG. 2. FIG. 4 is an enlarged view of a portion 'A' of FIG. 3, and FIG. 5A is an enlarged view of a portion 'B' of FIG. 4.

Referring to FIGS. 2 and 3, an electrode structure ST may be provided on a substrate 100. The substrate 100 may be or include a semiconductor substrate (e.g., a silicon substrate, a germanium substrate, or a silicon-germanium substrate). The electrode structure ST may include a plurality of insulating layers 110 and a plurality of gate electrodes 150L, 150 and 150U, which are stacked, e.g. alternately and repeatedly stacked in a first direction D1 perpendicular to a top surface 100U of the substrate 100. The plurality of gate electrodes 150L, 150, and 150U may include a ground selection gate electrode 150L on the substrate 100, a string selection gate electrode 150U on the ground selection gate electrode 150L, and cell gate electrodes 150 stacked between the ground selection gate electrode 150L and the string selection gate electrode 150U. The plurality of gate electrodes 150L, 150, and 150U may be separated from each other by the insulating layers 110 interposed therebetween. The electrode structure ST may further include a lower insulating layer 102 disposed between the ground selection gate electrode 150L and the substrate 100. The lower insulating layer 102 may be thinner than the insulating layers 110. A thickness of each of the lower insulating layer 102 and the insulating layers 110 may be measured along the first direction D1. The uppermost one of the insulating layers 110 may be stacked on the string selection gate electrode 150U.

For example, each of the insulating layers 110 may include at least one of a silicon oxide ($SiO_2$) layer, a silicon carbide (SiC) layer, a silicon oxynitride ($SiO_xN_y$) layer, or a silicon nitride ($Si_3N_4$) layer. For example, the lower insulating layer 102 may include at least one of a silicon oxide layer, a silicon nitride layer, or a high-k dielectric layer (e.g., an aluminum oxide layer and/or a hafnium oxide layer). For example, the plurality of gate electrodes 150L, 150 and 150U may include at least one of a doped semiconductor material (e.g., doped silicon), a metal (e.g., tungsten, copper, and/or aluminum), a conductive metal nitride (e.g., titanium nitride and/or tantalum nitride), or a transition metal (e.g., titanium and/or tantalum).

The string selection gate electrode 150U may include a pair of string selection gate electrodes 150U1 and 150U2 laterally spaced apart from each other. The pair of string selection gate electrodes 150U1 and 150U2 may be spaced apart from each other in a second direction D2 parallel to the top surface of the substrate 100. An isolation insulating pattern 165 may be disposed between the pair of string selection gate electrodes 150U1 and 150U2. The pair of string selection gate electrodes 150U1 and 150U2 may be isolated from each other by the isolation insulating pattern 165 interposed therebetween. The isolation insulating pattern 165 may include an insulating material (e.g., silicon oxide).

The electrode structure ST may have a line, e.g. a linear, shape extending in a third direction D3 when viewed in a plan view. The third direction D3 may be parallel to the top surface 100U of the substrate 100 and may intersect, e.g. perpendicularly intersect, the second direction D2. For example, each of the ground selection gate electrode 150L, the cell gate electrodes 150 and the string selection gate electrode 150U may have a line, e.g. a linear, shape extending in the third direction D3. When the string selection gate electrode 150U includes the pair of string selection gate electrodes 150U1 and 150U2, the pair of string selection gate electrodes 150U1 and 150U2 may extend in the third direction D3 and may be spaced apart from each other in the second direction D2. The isolation insulating pattern 165 may have a line, e.g. linear, shape extending in the third direction D3 between the pair of string selection gate electrodes 150U1 and 150U2.

Vertical semiconductor patterns VS may be provided on the substrate 100. Each of the vertical semiconductor patterns VS may extend in the first direction D1 to penetrate the electrode structure ST. An end portion (e.g., a bottom end portion) of each of the vertical semiconductor patterns VS may be disposed in the substrate 100 and may be connected to the substrate 100. The vertical semiconductor patterns VS may be arranged in a line and/or in a zigzag form in one direction when viewed in a plan view. For example, the vertical semiconductor patterns VS may be arranged in a zigzag form in the third direction D3.

Each of the vertical semiconductor patterns VS may include a lower semiconductor pattern LSP penetrating a lower portion of the electrode structure ST so as to be connected to the substrate 100, and an upper semiconductor pattern USP penetrating an upper portion of the electrode structure ST so as to be connected to the lower semiconductor pattern LSP. The lower semiconductor pattern LSP may penetrate the ground selection gate electrode 150L, and the upper semiconductor pattern USP may penetrate the cell gate electrodes 150 and the string selection gate electrode 150U.

The lower semiconductor pattern LSP may include a homo-epitaxial and/or hetero-epitaxial pattern formed using the substrate 100 as a seed. The lower semiconductor pattern LSP may include a semiconductor material having a single-crystalline or poly-crystalline structure and may have the same conductivity type as the substrate 100. In some example embodiments, the lower semiconductor pattern LSP may penetrate a portion of the substrate 100 and may be in contact with an inner surface of the substrate 100. The lower semiconductor pattern LSP may have a pillar shape.

Referring to FIG. 4, for example, the upper semiconductor pattern USP may have a hollow pipe or macaroni shape. A bottom end of the upper semiconductor pattern USP may be in a closed state. An inner space of the upper semiconductor pattern USP may be filled with a filling insulation pattern 140. A bottom surface USP_L of the upper semiconductor pattern USP may be located at a lower height than a top surface LSP_U of the lower semiconductor pattern LSP. Herein, the term 'height' may mean a distance measured from the top surface 100U of the substrate 100 in the first direction D1. An end portion (e.g., a bottom end portion) of the upper semiconductor pattern USP may be inserted in the lower semiconductor pattern LSP. The upper semiconductor pattern USP may include a semiconductor material such as silicon (Si), germanium (Ge), or a compound thereof. Alternatively or additionally, the upper semiconductor pattern USP may include a semiconductor material doped with or including dopants, or alternatively an intrinsic semiconductor material not doped with or not including dopants. The upper semiconductor pattern USP may include a semiconductor material having at least one of a single-crystalline structure, an amorphous structure, or a poly-crystalline structure. The filling insulation pattern 140 may include, for example, silicon oxide.

Referring to FIGS. 3 and 4, a data storage pattern 130 may be disposed between the electrode structure ST and each of the vertical semiconductor patterns VS. The data storage pattern 130 may have a pipe or macaroni shape having opened top and bottom ends and may surround each of the vertical semiconductor patterns VS. The data storage pattern 130 may be disposed between the upper semiconductor pattern USP and the electrode structure ST and may surround a sidewall of the upper semiconductor pattern USP. A bottom surface of the data storage pattern 130 may be in contact with the top surface LSP_U of the lower semiconductor pattern LSP.

The data storage pattern 130 may be or include a data storage layer of an NAND flash memory device. The data storage pattern 130 may include a first insulating pattern 130a, a second insulating pattern 130b, and a third insulating pattern 130c, which are sequentially stacked. The first insulating pattern 130a may be disposed between the electrode structure ST and each of the vertical semiconductor patterns VS, and the third insulating pattern 130c may be disposed between the first insulating pattern 130a and each of the vertical semiconductor patterns VS. The second insulating pattern 130b may be disposed between the first insulating pattern 130a and the third insulating pattern 130c. The second insulating pattern 130b may be or include a charge storage layer and may include, for example, a trap insulating layer, a floating gate electrode, or conductive nano-dots. For example, the second insulating pattern 130b may include at least one of a silicon nitride layer, a silicon oxynitride layer, a silicon-rich nitride layer, a nano-crystalline silicon layer, or a laminated trap layer. The first insulating pattern 130a may include a material of which an energy band gap is greater than that of the second insulating pattern 130b. The first insulating pattern 130a may be or include a blocking insulating layer and may include, for example, a high-k dielectric layer (e.g., an aluminum oxide layer and/or a hafnium oxide layer) and/or a silicon oxide layer. The third insulating pattern 130c may include a material of which an energy band gap is greater than that of the second insulating pattern 130b. The third insulating pattern 130c may be a tunnel insulating layer and may include, for example, a silicon oxide layer. The second insulating pattern 130b may include a material having an etch selectivity with respect to the first and third insulating patterns 130a and 130c.

Referring to FIGS. 4 and 5A, each of the first to third insulating patterns 130a, 130b, and 130c may include a horizontal portion HPa, HPb, and HPc, respectively, extending in the second direction D2, and a vertical portion VPa, VPb, and VPc, respectively, extending from the respective one of the horizontal portion HPa, HPb, and HPc in the first direction D1. The horizontal portion HPa of the first insulating pattern 130a, the horizontal portion HPb of the second insulating pattern 130b, and the horizontal portion HPc of the third insulating pattern 130c may be stacked, e.g., sequentially stacked, on the top surface LSP_U of the lower semiconductor pattern LSP in the first direction D1. The horizontal portion HPa of the first insulating pattern 130a may be adjacent to the lower semiconductor pattern LSP, and the horizontal portion HPc of the third insulating pattern 130c may be spaced apart from the lower semiconductor pattern LSP with the horizontal portion HPa of the first insulating pattern 130a interposed therebetween. The horizontal portion HPb of the second insulating pattern 130b may be disposed between the horizontal portion HPa of the first insulating pattern 130a and the horizontal portion HPc of the third insulating pattern 130c. The horizontal portion HPa of the first insulating pattern 130a may be in contact with the top surface LSP_U of the lower semiconductor pattern LSP.

The vertical portion VPa of the first insulating pattern 130a may be disposed between the upper semiconductor pattern USP and the electrode structure ST, and the vertical portion VPc of the third insulating pattern 130c may be disposed between the upper semiconductor pattern USP and the vertical portion VPa of the first insulating pattern 130a. The vertical portion VPb of the second insulating pattern 130b may be disposed between the vertical portion VPa of the first insulating pattern 130a and the vertical portion VPc of the third insulating pattern 130c. The vertical portion VPc of the third insulating pattern 130c may be in contact with the upper semiconductor pattern USP. The upper semiconductor pattern USP may cover a top surface of the horizontal portion HPc of the third insulating pattern 130c and may extend to cover sidewalls SSa, SSb, and SSc of the horizontal portions HPa, HPb, and HPc of the first to third insulating patterns 130a, 130b and 130c.

At least one of the horizontal portion HPa of the first insulating pattern 130a or the horizontal portion HPc of the third insulating pattern 130c may protrude beyond, e.g. extend further than, the sidewall SSb of the horizontal portion HPb of the second insulating pattern 130b in the second direction D2. In some example embodiments, each of the horizontal portions HPa and HPc of the first and third insulating patterns 130a and 130c may protrude beyond, e.g. extend further than the sidewall SSb of the horizontal portion HPb of the second insulating pattern 130b in the second direction D2. The horizontal portion HPa of the first insulating pattern 130a may have a first protrusion length PL1 as measured beginning from the sidewall SSb of the horizontal portion HPb of the second insulating pattern 130b, and the horizontal portion HPc of the third insulating pattern 130c may have a second protrusion length PL2 as measured beginning from the sidewall SSb of the horizontal portion HPb of the second insulating pattern 130b. In some example embodiments, the first protrusion length PL1 and the second protrusion length PL2 may be substantially equal to each other. The upper semiconductor pattern USP may extend between the horizontal portion HPa of the first insulating pattern 130a and the horizontal portion HPc of the third insulating pattern 130c so as to be in contact with the sidewall SSb of the horizontal portion HPb of the second insulating pattern 130b.

Referring again to FIGS. 2 and 3, a conductive pad 160 may be provided on each of the vertical semiconductor patterns VS. The conductive pad 160 may cover a top surface of the filling insulation pattern 140 and the topmost surface of the upper semiconductor pattern USP. The conductive pad 160 may include a semiconductor material including, e.g. doped with, dopants, and/or a conductive material. The data storage pattern 130 may extend from the sidewall of the upper semiconductor pattern USP onto a sidewall of the conductive pad 160. The data storage pattern 130 may surround the sidewall of the conductive pad 160, and the topmost surface of the data storage pattern 130 may be located at substantially the same height as a top surface of the conductive pad 160.

A gate dielectric pattern 172 may be disposed between the ground selection gate electrode 150L and the lower semiconductor pattern LSP. For example, the gate dielectric pattern 172 may include a silicon oxide layer. The gate dielectric pattern 172 may be formed by oxidizing, e.g. thermally oxidizing and/or oxidizing with in-situ steam generation (ISSG), a portion of the lower semiconductor pattern LSP.

A horizontal insulator 175 may be provided on top and bottom surfaces of each of the gate electrodes 150L, 150 and 150U. The horizontal insulator 175 may extend between the data storage pattern 130 and each of the string selection gate electrode 150U and the cell gate electrodes 150 or between the gate dielectric pattern 172 and the ground selection gate electrode 150L. The horizontal insulator 175 may be formed of a single layer or a multi-layer. In some example embodiments, the horizontal insulator 175 may include a blocking insulating layer (e.g., a high-k dielectric layer) of a charge trap-type flash memory transistor.

Common source plugs 180 may be provided at both sides of the electrode structure ST, respectively, and may be connected to the substrate 100. The common source plugs 180 may extend in the third direction D3 and may be spaced apart from each other in the second direction D2 with the electrode structure ST interposed therebetween. The electrode structure ST may be disposed on the substrate 100 between common source regions 170 adjacent to each other. The common source regions 170 may be provided in the substrate 100 at both sides of the electrode structure ST and may extend in the third direction D3. The common source regions 170 may be spaced apart from each other in the second direction D2 with the electrode structure ST interposed therebetween. The common source regions 170 may be portions of the substrate 100, which are doped with dopants. The common source plugs 180 may be connected to the common source regions 170, respectively. Sidewall insulating spacers 185 may be provided on both sidewalls of the electrode structure ST, respectively. Each of the sidewall insulating spacers 185 may be disposed between the electrode structure ST and each of the common source plugs 180 and may be in contact with the substrate 100 or each of the common source regions 170. The common source plugs 180 may include a conductive material, and the sidewall insulating spacers 185 may include, for example, silicon nitride.

A capping insulating layer 190 may be provided on the electrode structure ST and may cover a top surface of the electrode structure ST and the top surfaces of the conductive pads 160. A top surface of the capping insulating layer 190 may be located at substantially the same height as top surfaces of the common source plugs 180. An interlayer insulating layer 195 may be provided on the capping insulating layer 190 and may cover the top surfaces of the common source plugs 180. The capping insulating layer 190 and the interlayer insulating layer 195 may include an insulating material (e.g., silicon oxide). A first contact 192 may be provided on the conductive pad 160. The first contact 192 may penetrate the capping insulating layer 190 so as to be connected to the conductive pad 160. A second contact 197 may penetrate the interlayer insulating layer 195 so as to be connected to the first contact 192. The first and second contacts 192 and 197 may include a conductive material. Bit lines 200 may be provided on the interlayer insulating layer 195. The bit lines 200 may extend in the second direction D2 and may be spaced apart from each other in the third direction D3. The vertical semiconductor patterns VS may include a dummy vertical semiconductor pattern DVS which is not connected to the first contact 192 or the second contact 197. Except for the dummy vertical semiconductor pattern DVS, each of the other vertical semiconductor patterns VS may be electrically connected to a corresponding one of the bit lines 200 through the first and second contacts 192 and 197. The bit lines 200 may include a conductive material.

Figure 5B:
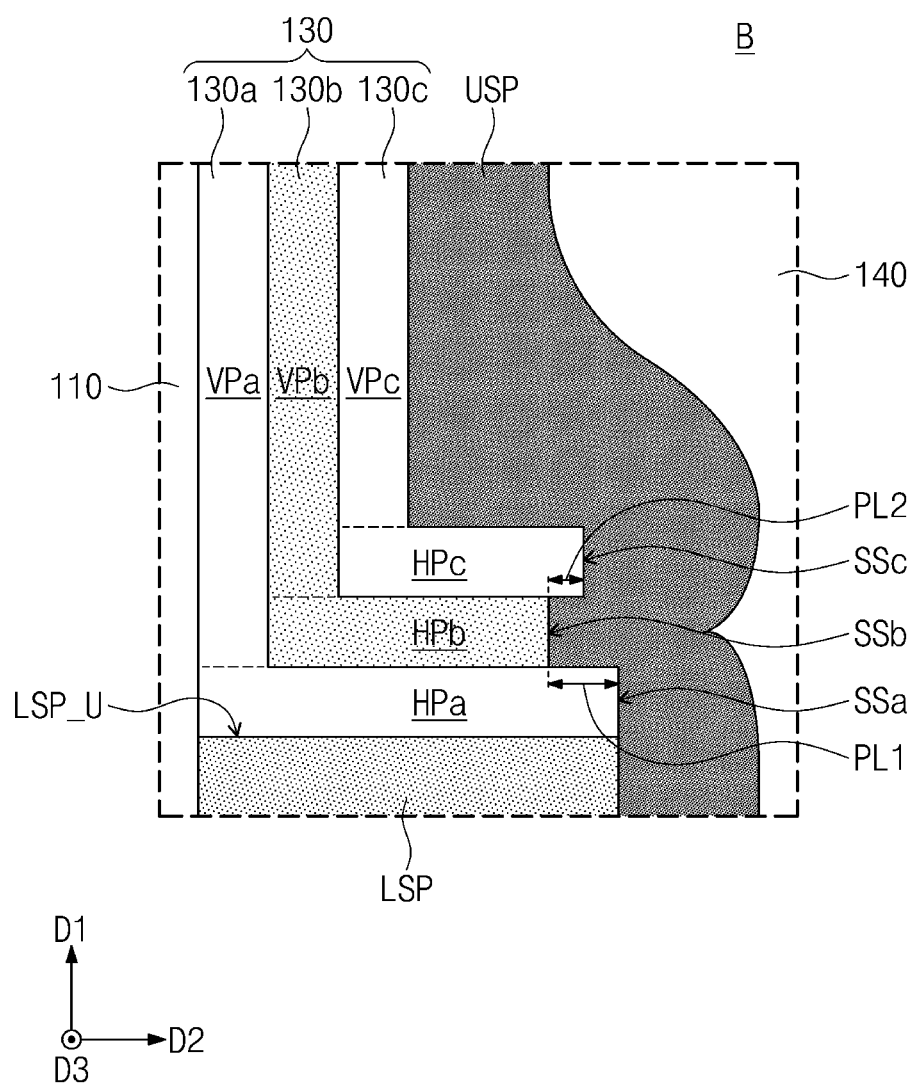
FIGS. 5B to 5G are enlarged cross-sectional views corresponding to the portion 'B' of FIG. 4 to illustrate portions of 3D semiconductor memory devices according to some example embodiments of inventive concepts.

FIG. 5B is an enlarged cross-sectional view corresponding to the portion 'B' of FIG. 4 to illustrate a portion of a 3D semiconductor memory device according to some example embodiments of inventive concepts. Hereinafter, differences between embodiments described with reference to FIGS. 2 to 4 and 5A will be mainly mentioned for the purpose of ease and convenience in explanation.

Referring to FIGS. 4 and 5B, at least one of the horizontal portion HPa of the first insulating pattern 130a or the horizontal portion HPc of the third insulating pattern 130c may protrude beyond, e.g. extend further than, the sidewall SSb of the horizontal portion HPb of the second insulating pattern 130b in the second direction D2. In some example embodiments, each of the horizontal portions HPa and HPc of the first and third insulating patterns 130a and 130c may protrude beyond, e.g. extend further than, the sidewall SSb of the horizontal portion HPb of the second insulating pattern 130b in the second direction D2. The horizontal portion HPa of the first insulating pattern 130a may have a first protrusion length PL1 as measured beginning from the sidewall SSb of the horizontal portion HPb of the second insulating pattern 130b, and the horizontal portion HPc of the third insulating pattern 130c may have a second protrusion length PL2 as measured beginning from the sidewall SSb of the horizontal portion HPb of the second insulating pattern 130b. In some example embodiments, the first protrusion length PL1 may be greater than the second protrusion length PL2. For example, the horizontal portion HPa of the first insulating pattern 130a may protrude more than the horizontal portion HPc of the third insulating pattern 130c, from the sidewall SSb of the horizontal portion HPb of the second insulating pattern 130b. The upper semiconductor pattern USP may extend between the horizontal portion HPa of the first insulating pattern 130a and the horizontal portion HPc of the third insulating pattern 130c so as to be in contact with the sidewall SSb of the horizontal portion HPb of the second insulating pattern 130b.

Figure 5C:
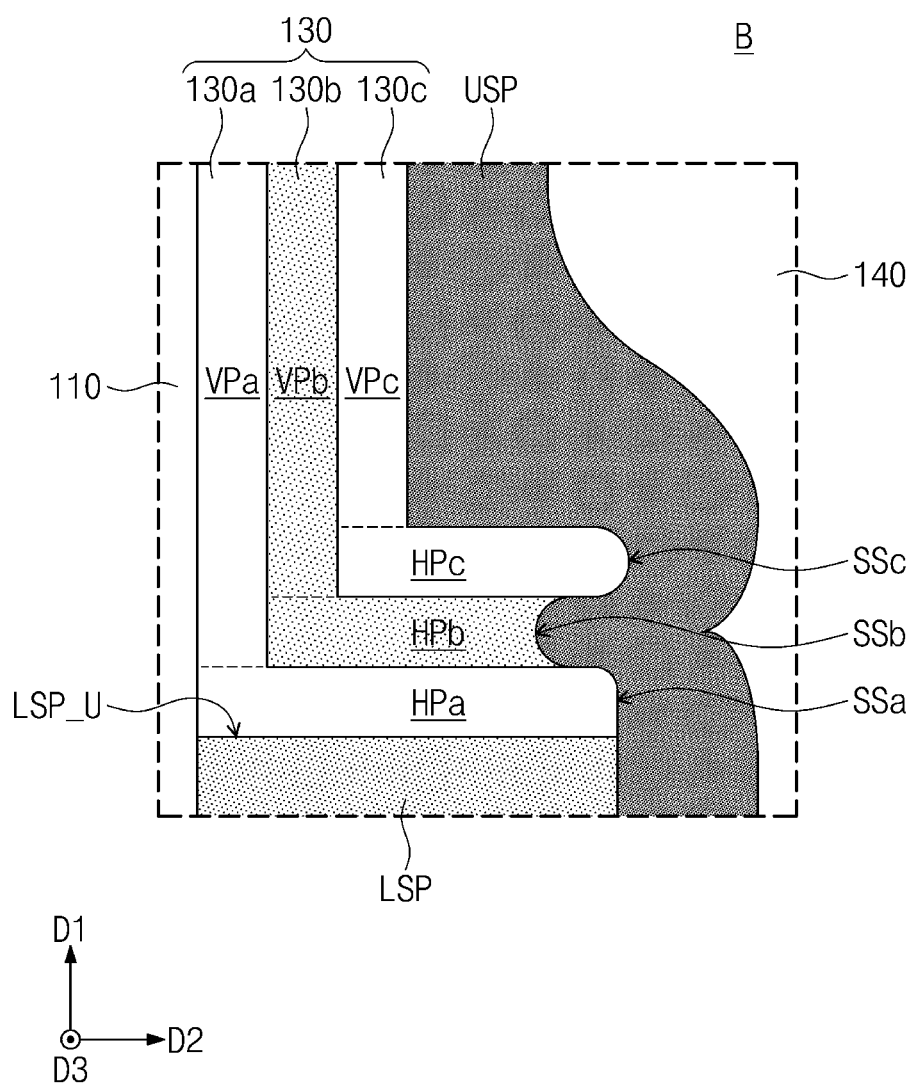

FIG. 5C is an enlarged cross-sectional view corresponding to the portion 'B' of FIG. 4 to illustrate a portion of a 3D semiconductor memory device according to some example embodiments of inventive concepts. Hereinafter, differences between example embodiments described with reference to FIGS. 2 to 4 and 5A will be mainly mentioned for the purpose of ease and convenience in explanation.

Referring to FIGS. 4 and 5C, at least one of the horizontal portion HPa of the first insulating pattern 130a or the horizontal portion HPc of the third insulating pattern 130c may protrude from the sidewall SSb of the horizontal portion HPb of the second insulating pattern 130b in the second direction D2. In some example embodiments, each of the horizontal portions HPa and HPc of the first and third insulating patterns 130a and 130c may protrude beyond, e.g. extend further than, the sidewall SSb of the horizontal portion HPb of the second insulating pattern 130b in the second direction D2. According to some example embodiments, the sidewall SSc of the horizontal portion HPc of the third insulating pattern 130c may include a convex surface protruding toward the outside of the third insulating pattern 130c, and the sidewall SSb of the horizontal portion HPb of the second insulating pattern 130b may include a concave surface recessed toward the inside of the second insulating pattern 130b. At least a portion of the sidewall SSa of the horizontal portion HPa of the first insulating pattern 130a may include a convex surface protruding toward the outside of the first insulating pattern 130a. The upper semiconductor pattern USP may extend between the horizontal portion HPa of the first insulating pattern 130a and the horizontal portion HPc of the third insulating pattern 130c so as to be in contact with the sidewall SSb of the horizontal portion HPb of the second insulating pattern 130b.

Figure 5D:
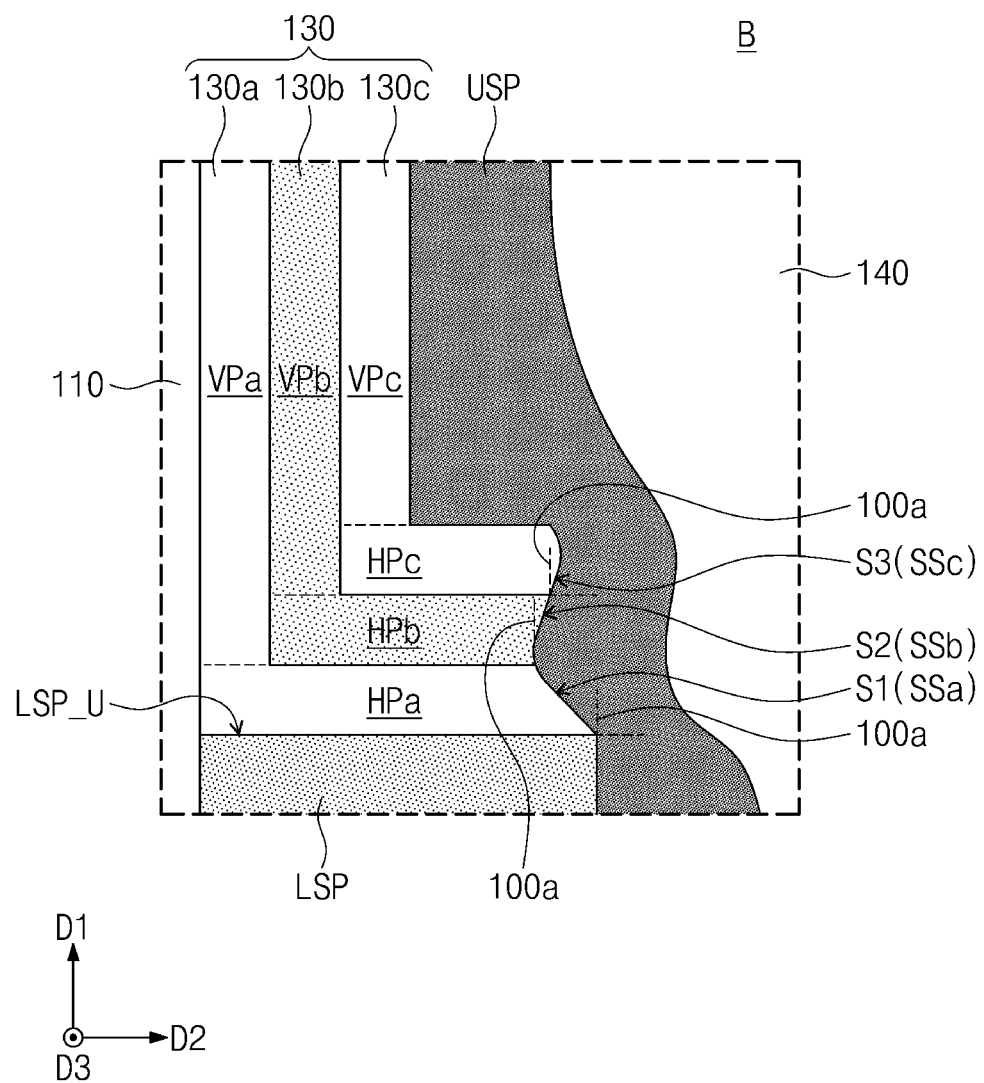

FIG. 5D is an enlarged cross-sectional view corresponding to the portion 'B' of FIG. 4 to illustrate a portion of a 3D semiconductor memory device according to some example embodiments of inventive concepts. Hereinafter, differences between some example embodiments and the above embodiments described with reference to FIGS. 2 to 4 and 5A will be mainly mentioned for the purpose of ease and convenience in explanation.

Referring to FIGS. 4 and 5D, at least one of the horizontal portion HPa of the first insulating pattern 130a or the horizontal portion HPc of the third insulating pattern 130c may protrude from the sidewall SSb of the horizontal portion HPb of the second insulating pattern 130b in the second direction D2. In some example embodiments, each of the horizontal portions HPa and HPc of the first and third insulating patterns 130a and 130c may protrude, e.g. extend further than, the sidewall SSb of the horizontal portion HPb of the second insulating pattern 130b in the second direction D2. According to some example embodiments, the sidewall SSa of the horizontal portion HPa of the first insulating pattern 130a may include a first inclined surface S1, and the sidewall SSb of the horizontal portion HPb of the second insulating pattern 130b may include a second inclined surface S2. The first inclined surface S1 and the second inclined surface S2 may be inclined in opposite directions to each other from a normal line 100a perpendicular to the top surface 100U of the substrate 100. For example, the second inclined surface S2 may be inclined in the second direction D2 from the normal line 100a, and the first inclined surface S1 may be inclined in an opposite direction to the second direction D2 from the normal line 100a. The sidewall SSc of the horizontal portion HPc of the third insulating pattern 130c may include a third inclined surface S3. The third inclined surface S3 and the second inclined surface S2 may be inclined in the same direction from the normal line 100a. For example, the third inclined surface S3 may be inclined in the second direction D2 from the normal line 100a. The second inclined surface S2 may be aligned with the third inclined surface S3. The first inclined surface S1 may be offset from the second inclined surface S2 in the second direction D2. The upper semiconductor pattern USP may extend between the horizontal portion HPa of the first insulating pattern 130a and the horizontal portion HPc of the third insulating pattern 130c so as to be in contact with the sidewall SSb of the horizontal portion HPb of the second insulating pattern 130b.

Figure 5E:
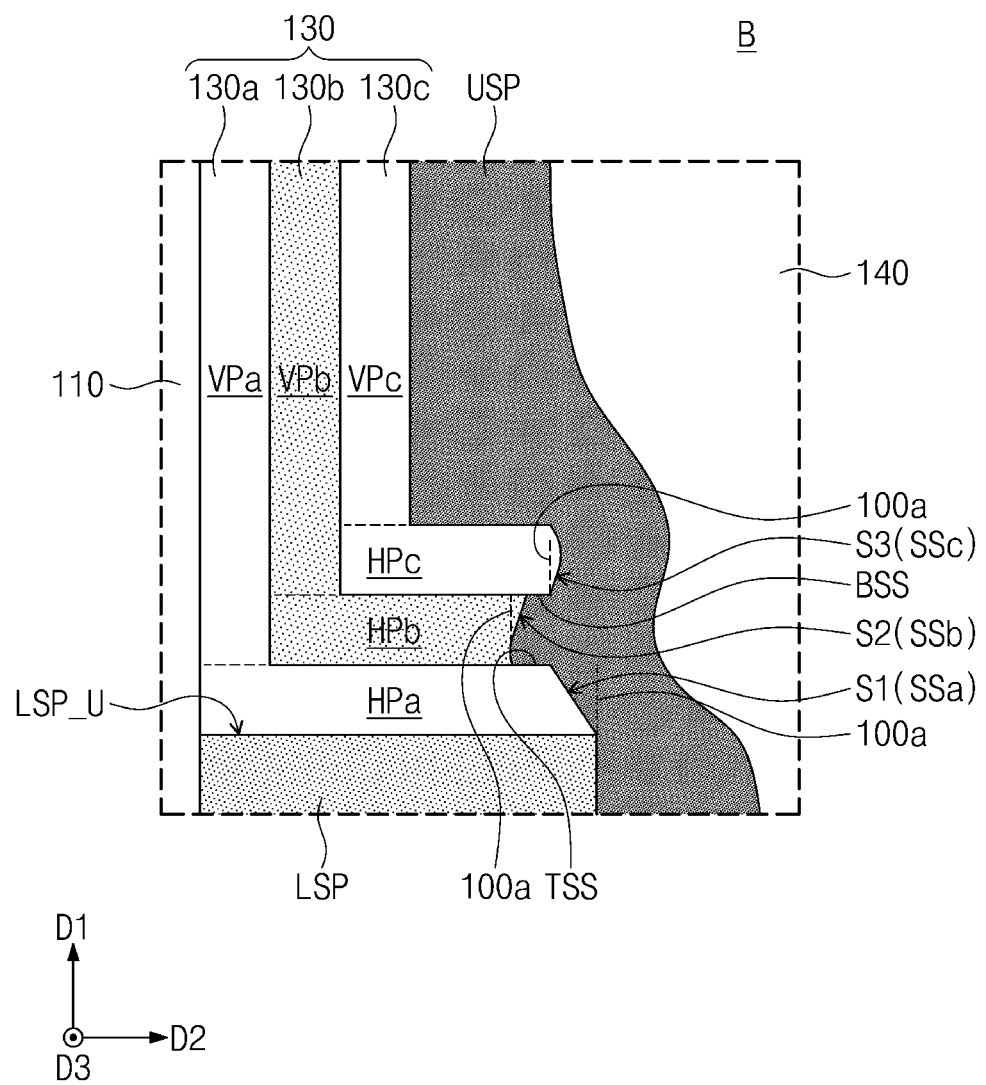

FIG. 5E is an enlarged cross-sectional view corresponding to the portion 'B' of FIG. 4 to illustrate a portion of a 3D semiconductor memory device according to some example embodiments of inventive concepts. Hereinafter, differences between example embodiments described with reference to FIGS. 2 to 4 and 5A will be mainly mentioned for the purpose of ease and convenience in explanation.

Referring to FIGS. 4 and 5E, at least one of the horizontal portion HPa of the first insulating pattern 130a or the horizontal portion HPc of the third insulating pattern 130c may protrude from the sidewall SSb of the horizontal portion HPb of the second insulating pattern 130b in the second direction D2. In some example embodiments, each of the horizontal portions HPa and HPc of the first and third insulating patterns 130a and 130c may protrude from the sidewall SSb of the horizontal portion HPb of the second insulating pattern 130b in the second direction D2. According to some example embodiments, as described with reference to FIGS. 4 and 5D, the first inclined surface S1 and the second inclined surface S2 may be inclined in opposite directions to each other from the normal line 100a, and the third inclined surface S3 and the second inclined surface S2 may be inclined in the same direction from the normal line 100a. For example, the second inclined surface S2 may be inclined in the second direction D2 from the normal line 100a, and the first inclined surface S1 may be inclined in the opposite direction to the second direction D2 from the normal line 100a. The third inclined surface S3 may be inclined in the second direction D2 from the normal line 100a.

The third inclined surface S3 may be offset from the second inclined surface S2 in the second direction D2. A bottom surface BSS of the horizontal portion HPc of the third insulating pattern 130c may be disposed between the second inclined surface S2 and the third inclined surface S3. The bottom surface BSS of the horizontal portion HPc of the third insulating pattern 130c may be substantially parallel to the top surface 100U of the substrate 100. The first inclined surface S1 may be offset from the second inclined surface S2 in the second direction D2. A top surface TSS of the horizontal portion HPa of the first insulating pattern 130a may be disposed between the first inclined surface S1 and the second inclined surface S2. The top surface TSS of the horizontal portion HPa of the first insulating pattern 130a may be substantially parallel to the top surface 100U of the substrate 100.

Figure 5F:
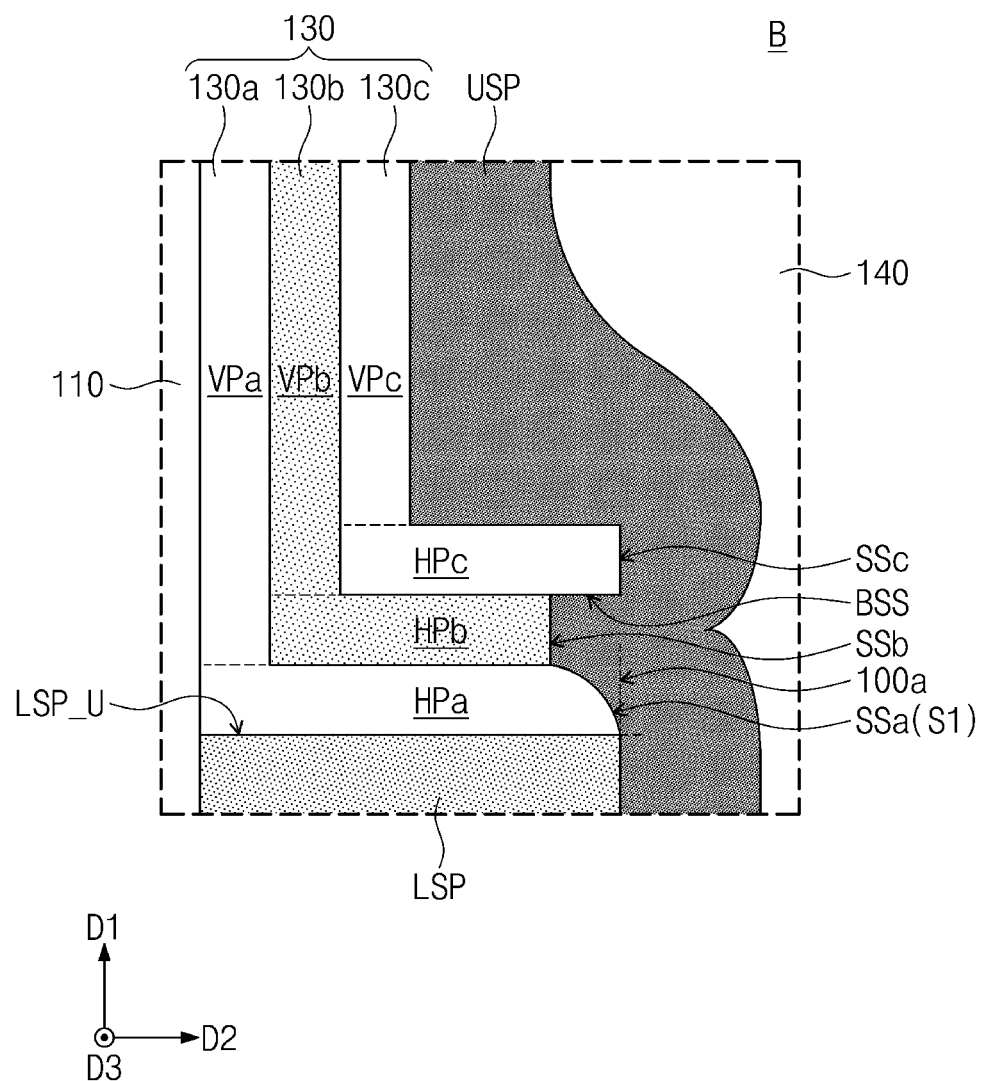

FIG. 5F is an enlarged cross-sectional view corresponding to the portion 'B' of FIG. 4 to illustrate a portion of a 3D semiconductor memory device according to some example embodiments of inventive concepts. Hereinafter, differences between example embodiments with reference to FIGS. 2 to 4 and 5A will be mainly mentioned for the purpose of ease and convenience in explanation.

Referring to FIGS. 4 and 5F, at least one of the horizontal portion HPa of the first insulating pattern 130a or the horizontal portion HPc of the third insulating pattern 130c may protrude from the sidewall SSb of the horizontal portion HPb of the second insulating pattern 130b in the second direction D2. In some example embodiments, each of the horizontal portions HPa and HPc of the first and third insulating patterns 130a and 130c may protrude from the sidewall SSb of the horizontal portion HPb of the second insulating pattern 130b in the second direction D2. According to some example embodiments, the sidewall SSa of the horizontal portion HPa of the first insulating pattern 130a may include a first inclined surface S1. The first inclined surface S1 may be inclined in an opposite direction to the second direction D2 from the normal line 100a perpendicular to the top surface 100U of the substrate 100. Alternatively or additionally, the first inclined surface S1 may be or include a curved surface which is convex toward the outside of the horizontal portion HPa of the first insulating pattern 130a. The sidewall SSc of the horizontal portion HPc of the third insulating pattern 130c may be offset from the sidewall SSb of the horizontal portion HPb of the second insulating pattern 130b in the second direction D2. A bottom surface BSS of the horizontal portion HPc of the third insulating pattern 130c may be disposed between the sidewall SSc of the horizontal portion HPc of the third insulating pattern 130c and the sidewall SSb of the horizontal portion HPb of the second insulating pattern 130b. The bottom surface BSS of the horizontal portion HPc of the third insulating pattern 130c may be substantially parallel to the top surface 100U of the substrate 100.

The upper semiconductor pattern USP may extend between the horizontal portion HPa of the first insulating pattern 130a and the horizontal portion HPc of the third insulating pattern 130c so as to be in contact with the sidewall SSb of the horizontal portion HPb of the second insulating pattern 130b.

Figure 5G:
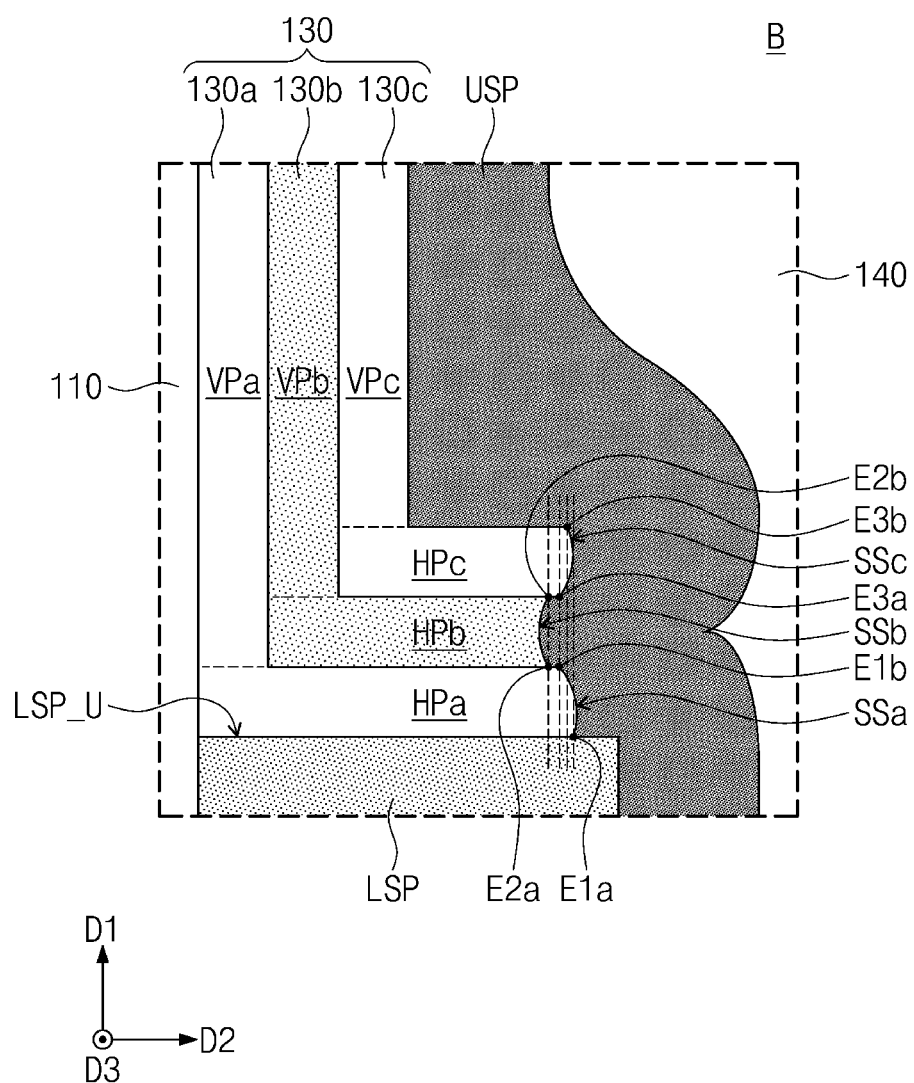

FIG. 5G is an enlarged cross-sectional view corresponding to the portion 'B' of FIG. 4 to illustrate a portion of a 3D semiconductor memory device according to some example embodiments of inventive concepts. Hereinafter, differences between some example embodiments and the above embodiments described with reference to FIGS. 2 to 4 and 5A will be mainly mentioned for the purpose of ease and convenience in explanation.

Referring to FIGS. 4 and 5G, each of the horizontal portion HPa of the first insulating pattern 130a and the horizontal portion HPc of the third insulating pattern 130c may protrude beyond, e.g. extend further than, the sidewall SSb of the horizontal portion HPb of the second insulating pattern 130b in the second direction D2. The sidewall SSb of the horizontal portion HPb of the second insulating pattern 130b may include a concave surface recessed toward the inside of the second insulating pattern 130b, and the sidewall SSc of the horizontal portion HPc of the third insulating pattern 130c may include a convex surface protruding toward the outside of the third insulating pattern 130c. At least a portion of the sidewall SSa of the horizontal portion HPa of the first insulating pattern 130a may include a convex surface protruding toward the outside of the first insulating pattern 130a.

According to some example embodiments, a lower edge E3a of the sidewall SSc of the horizontal portion HPc of the third insulating pattern 130c may protrude beyond, e.g. extend further than, an upper edge E2b of the sidewall SSb of the horizontal portion HPb of the second insulating pattern 130b in the second direction D2. Alternatively, unlike FIG. 5G, the lower edge E3a of the sidewall SSc of the horizontal portion HPc of the third insulating pattern 130c may overlap with the upper edge E2b of the sidewall SSb of the horizontal portion HPb of the second insulating pattern 130b. An upper edge E3b of the sidewall SSc of the horizontal portion HPc of the third insulating pattern 130c may protrude from the lower edge E3a of the sidewall SSc of the horizontal portion HPc of the third insulating pattern 130c in the second direction D2. In some example embodiments, an upper edge E1b of the sidewall SSa of the horizontal portion HPa of the first insulating pattern 130a may protrude from a lower edge E2a of the sidewall SSb of the horizontal portion HPb of the second insulating pattern 130b in the second direction D2. In certain embodiments, unlike FIG. 5G, the upper edge E1b of the sidewall SSa of the horizontal portion HPa of the first insulating pattern 130a may overlap with the lower edge E2a of the sidewall SSb of the horizontal portion HPb of the second insulating pattern 130b. A lower edge E1a of the sidewall SSa of the horizontal portion HPa of the first insulating pattern 130a may protrude beyond, e.g. extend further than, the upper edge E1b of the sidewall SSa of the horizontal portion HPa of the first insulating pattern 130a in the second direction D2.

FIGS. 6 to 14 are cross-sectional views corresponding to the line I-I' of FIG. 2 to illustrate a method of manufacturing a 3D semiconductor memory device, according to some example embodiments of inventive concepts. Hereinafter, the descriptions to the same technical features as described with reference to FIGS. 2 to 4 and 5A to 5G will be omitted or mentioned briefly for the purpose of ease and convenience in explanation.

Figure 6:
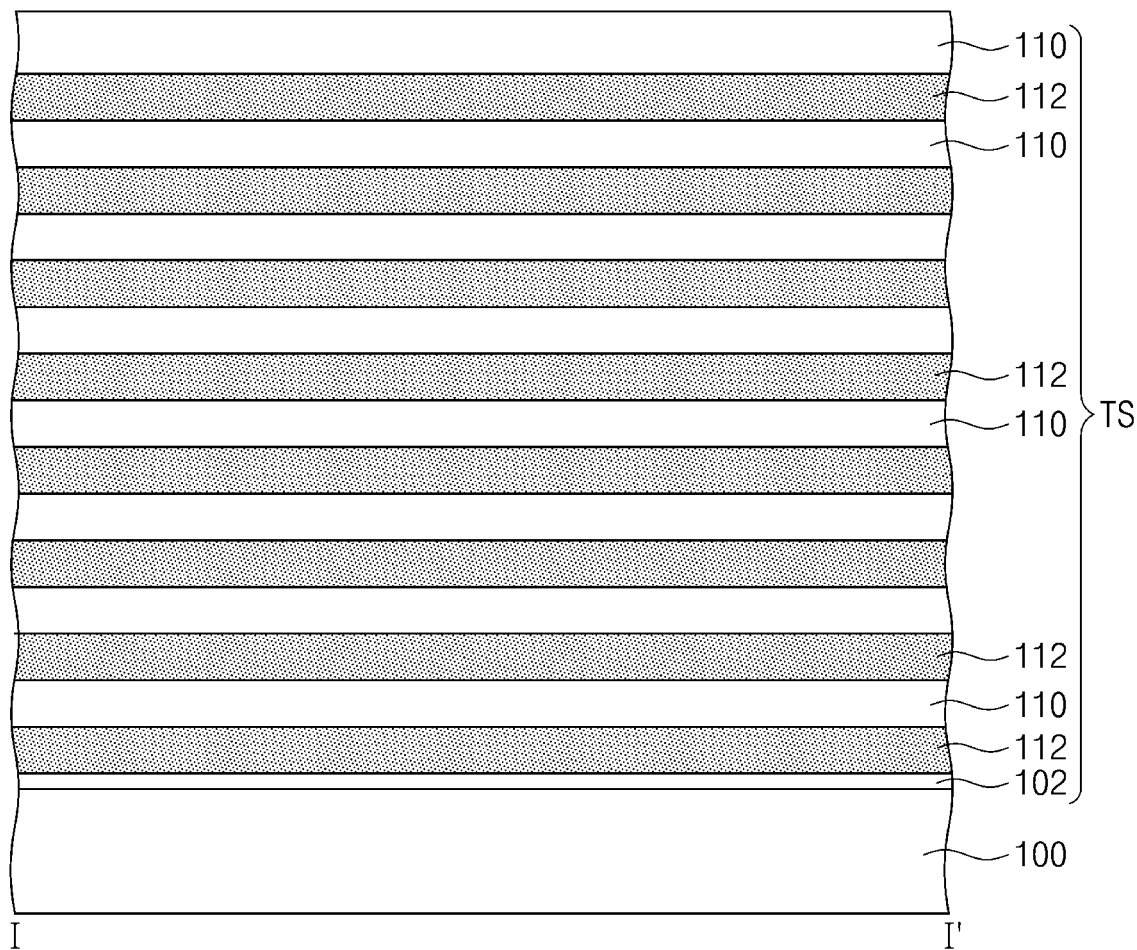
FIGS. 6 to 14 are cross-sectional views corresponding to the line I-I' of FIG. 2 to illustrate a method of manufacturing a 3D semiconductor memory device, according to some example embodiments of inventive concepts.

Referring to FIGS. 2 and 6, a thin-layer structure TS may be formed on a substrate 100. The thin-layer structure TS may include a lower insulating layer 102 on the substrate 100, and sacrificial layers 112 and insulating layers 110 alternately and repeatedly stacked on the lower insulating layer 102. In some example embodiments, the lower insulating layer 102 may include a silicon oxide layer formed by a thermal oxidation process and/or a deposition technique. In some example embodiments, thicknesses of the sacrificial layers 112 may be equal to each other. In certain embodiments, the lowermost one of the sacrificial layers 112 may be thicker than others of the sacrificial layers 112, which are stacked thereon. In certain embodiments, the uppermost one of the sacrificial layers 112 may be thicker than others of the sacrificial layers 112, which are provided thereunder. Thicknesses of the insulating layers 110 may be equal to each other, or the lowermost one of the insulating layers 110 may be thicker than other insulating layers 110 stacked thereon. The lower insulating layer 102 may be thinner than the sacrificial layers 112 and the insulating layers 110.

Each of the sacrificial layers 112 and the insulating layers 110 may be formed using, for example, at least one of a thermal chemical vapor deposition (thermal CVD) process, a plasma-enhanced CVD process, a physical CVD process, or an atomic layer deposition (ALD) process. In some example embodiments, the sacrificial layers 112 may include a material having an etch selectivity with respect to the insulating layers 110. For example, each of the sacrificial layers 112 may include at least one of a silicon layer, a silicon oxide layer, a silicon carbide layer, a silicon oxynitride layer, or a silicon nitride layer. Each of the insulating layers 110 may include at least one of a silicon oxide layer, a silicon carbide layer, a silicon oxynitride layer, or a silicon nitride layer. Here, the insulating layers 110 may include a different material from that of the sacrificial layers 112. In some example embodiments, each of the sacrificial layers 112 may be formed of a silicon nitride layer, and each of the insulating layers 110 may be formed of a silicon oxide layer. In certain embodiments, the sacrificial layers 112 may be formed of a conductive material, and the insulating layers 110 may be formed of an insulating material.

Figure 7:
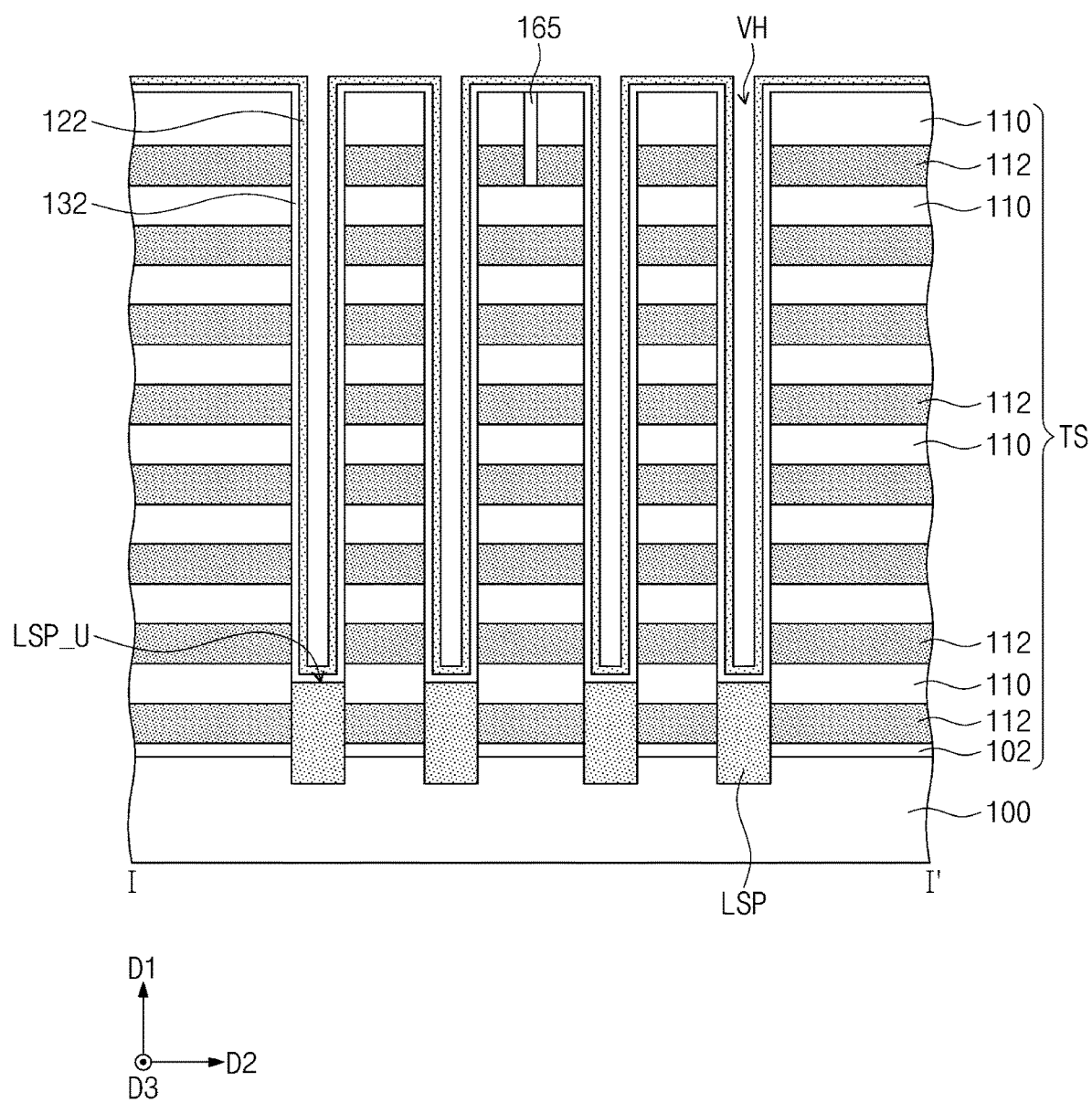

Referring to FIGS. 2 and 7, an isolation insulating pattern 165 may be formed in the thin-layer structure TS. The isolation insulating pattern 165 may divide the uppermost one of the sacrificial layers 112. For example, by the isolation insulating pattern 165, the uppermost sacrificial layer 112 may be divided into a pair of sacrificial layers 112 laterally spaced apart from each other. At least one vertical hole VH may be formed to penetrate the thin-layer structure TS. The at least one vertical hole VH may expose the substrate 100. The at least one vertical hole VH may be formed in plurality in the thin-layer structure TS, and the plurality of the vertical holes VH may be arranged in the third direction D3 when viewed in a plan view. In some example embodiments, the vertical holes VH may be arranged in a zigzag form along the third direction D3. The formation of the vertical hole VH may include forming a mask pattern (not shown) having an opening defining the vertical hole VH on the thin-layer structure TS, and etching, e.g. anisotropically etching, e.g. anisotropically etching with a reactive ion etch, the thin-layer structure TS using the mask pattern as an etch mask. A top surface of the substrate 100 under the vertical hole VH may be recessed by over-etching of the anisotropic etching process. Thus, the vertical hole VH may expose a portion of the substrate 100.

A lower semiconductor pattern LSP may be formed to fill a lower region of the vertical hole VH. The lower semiconductor pattern LSP may be formed by performing heterogeneous or homogenous selective epitaxial growth (SEG) process using the substrate 100 exposed by the vertical hole VH as a seed. The lower semiconductor pattern LSP may have a pillar shape penetrating at least a portion of the substrate 100. The lower semiconductor pattern LSP may cover a sidewall of at least one of the sacrificial layers 112. A top surface LSP_U of the lower semiconductor pattern LSP may be located at a height between the sacrificial layers 112, e.g. the two bottommost sacrificial layers 112, vertically adjacent to each other. The lower semiconductor pattern LSP may have a single-crystalline structure or a poly-crystalline structure. The lower semiconductor pattern LSP may include, but not limited to, silicon. The lower semiconductor pattern LSP may have the same conductivity type as the substrate 100. For example, impurities may be incorporated during the SEG process; however, inventive concepts are not limited thereto.

A data storage layer 132 may be formed on the thin-layer structure TS to partially fill the at least one vertical hole VH. The data storage layer 132 may cover an inner surface of the vertical hole VH with a substantially uniform thickness and may cover the top surface LSP_U of the lower semiconductor pattern LSP. The data storage layer 132 may include a first insulating layer, a second insulating layer, and a third insulating layer, which are sequentially stacked on the inner surface of the vertical hole VH. The first insulating layer, the second insulating layer, and the third insulating layer may correspond to a blocking insulating layer, a charge storage layer, and a tunnel insulating layer of an NAND flash memory device, respectively. The data storage layer 132 may be deposited by at least one of a plasma-enhanced CVD process, a physical CVD process, or an ALD process.

A sacrificial mask layer 122 may be formed on the data storage layer 132 to partially fill the vertical hole VH. The sacrificial mask layer 122 may cover the inner surface of the vertical hole VH with a substantially uniform thickness and may cover the top surface LSP_U of the lower semiconductor pattern LSP. The data storage layer 132 may be disposed between a top surface of the thin-layer structure TS and the sacrificial mask layer 122, between the inner surface of the vertical hole VH and the sacrificial mask layer 122, and between the top surface LSP_U of the lower semiconductor pattern LSP and the sacrificial mask layer 122. The sacrificial mask layer 122 may include a semiconductor material (e.g., silicon). The sacrificial mask layer 122 may be deposited using an ALD process and/or a CVD process.

Figure 8:
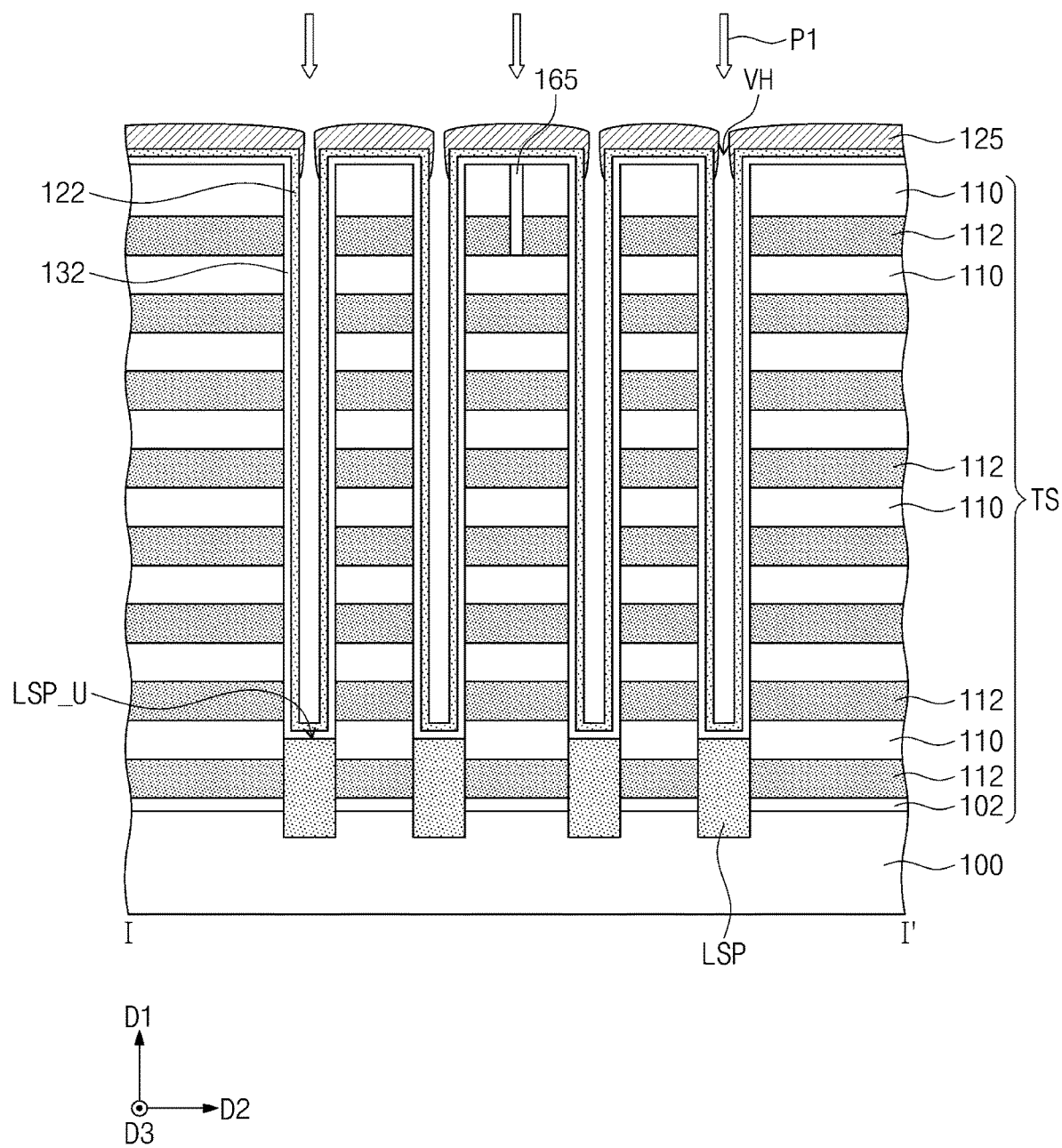

Referring to FIGS. 2 and 8, a first etching process P1 may be performed on the thin-layer structure TS. The performing of the first etching process P1 may include forming a first protective layer 125 on the thin-layer structure TS, and anisotropically etching the sacrificial mask layer 122 using the first protective layer 125 as an etch mask. The first protective layer 125 may partially fill a top end region of the vertical hole VH, and thus an opening of the top end region of the vertical hole VH may become narrow. The formation of the first protective layer 125 and the openings through which the sacrificial mask layer 122 is formed may not include using another mask layer to pattern and expose the vertical holes VH. For example, the first protective layer 125 may be formed on an upper surface of the sacrificial mask layer 122, and during the formation of the sacrificial mask layer 122 may partially bread-loaf above the vertical holes VH, while maintaining the vertical holes VH having a potentially smaller diameter, through which the first etching process P1 anisotropically etches the sacrificial mask layer 122. A portion of an etching source may be screened by the first protective layer 125 during the anisotropic etching of the sacrificial mask layer 122, and thus etching of the sacrificial mask layer 122 on the inner surface of the vertical hole VH may be suppressed. During the anisotropic etching of the sacrificial mask layer 122, another portion of the etching source may be reached into the vertical hole VH to etch a portion of the sacrificial mask layer 122 on the top surface LSP_U of the lower semiconductor pattern LSP. The first protective layer 125 may be etched during the anisotropic etching of the sacrificial mask layer 122, and thus a portion of the sacrificial mask layer 122 on the top surface of the thin-layer structure TS may be etched.

The first protective layer 125 may be or include a carbon-containing layer or a silicon-containing layer. During the first etching process P1, the forming of the first protective layer 125 and the anisotropic etching of the sacrificial mask layer 122 may be repeated one or more times.

Figure 9:
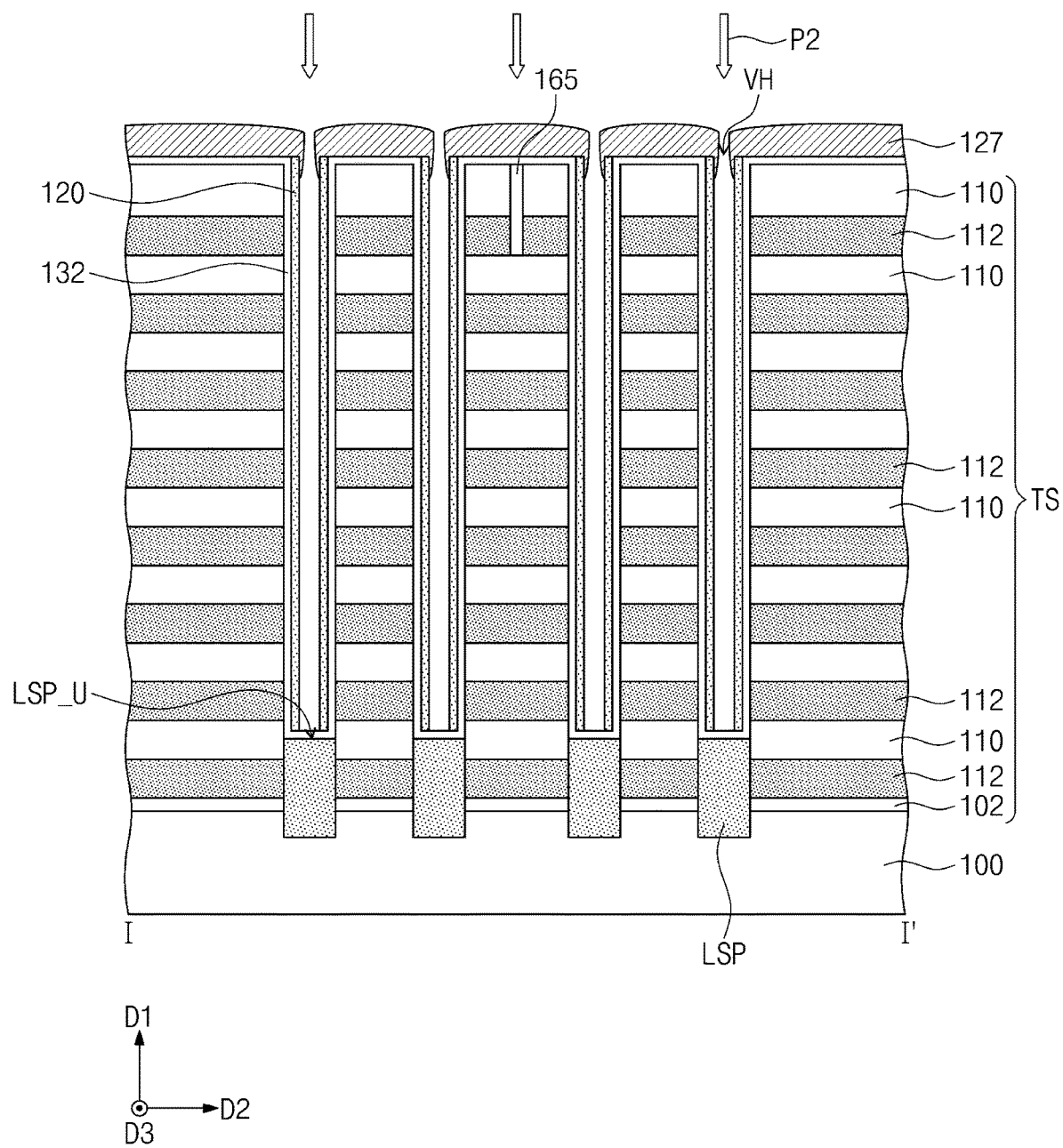

Referring to FIGS. 2 and 9, a sacrificial spacer 120 may be formed by the anisotropic etching of the sacrificial mask layer 122. The sacrificial spacer 120 may be locally formed on the inner surface of the vertical hole VH and may expose a portion of the data storage layer 132 on the top surface LSP_U of the lower semiconductor pattern LSP.

A second etching process P2 may be performed on the thin-layer structure TS. The performing of the second etching process P2 may include forming a second protective layer 127 on the thin-layer structure TS, and anisotropically etching the data storage layer 132 using the second protective layer 127 and the sacrificial spacer 120 as etch masks. The second protective layer 127 may partially fill the top end region of the vertical hole VH, and thus an opening of the top end region of the vertical hole VH may become narrow. A portion of an etching source may be screened by the second protective layer 127 during the anisotropic etching of the data storage layer 132, and thus etching of the sacrificial spacer 120 on the inner surface of the vertical hole VH may be suppressed. The formation of the second protective layer 127 and the openings through which the sacrificial spacer 120 is formed may not include using another mask layer to pattern and expose the vertical holes VH. For example, the second protective layer 127 may be formed on an upper surface of the sacrificial spacer 120, and during the formation of the sacrificial spacer 120 may partially bread-loaf above the vertical holes VH, while maintaining the vertical holes VH having a potentially smaller diameter, through which the second etching process P2 anisotropically etches the sacrificial spacer 120. During the anisotropic etching of the data storage layer 132, another portion of the etching source may be reached into the vertical hole VH to etch the portion of the data storage layer 132 on the top surface LSP_U of the lower semiconductor pattern LSP. The second protective layer 127 may be etched during the anisotropic etching of the data storage layer 132, and thus a portion of the data storage layer 132 on the top surface of the thin-layer structure TS may be etched.

The second protective layer 127 may be or include a carbon-containing layer or a silicon-containing layer. During the second etching process P2, the forming of the second protective layer 127 and the anisotropic etching of the data storage layer 132 may be repeated one or more times.

Figure 10:
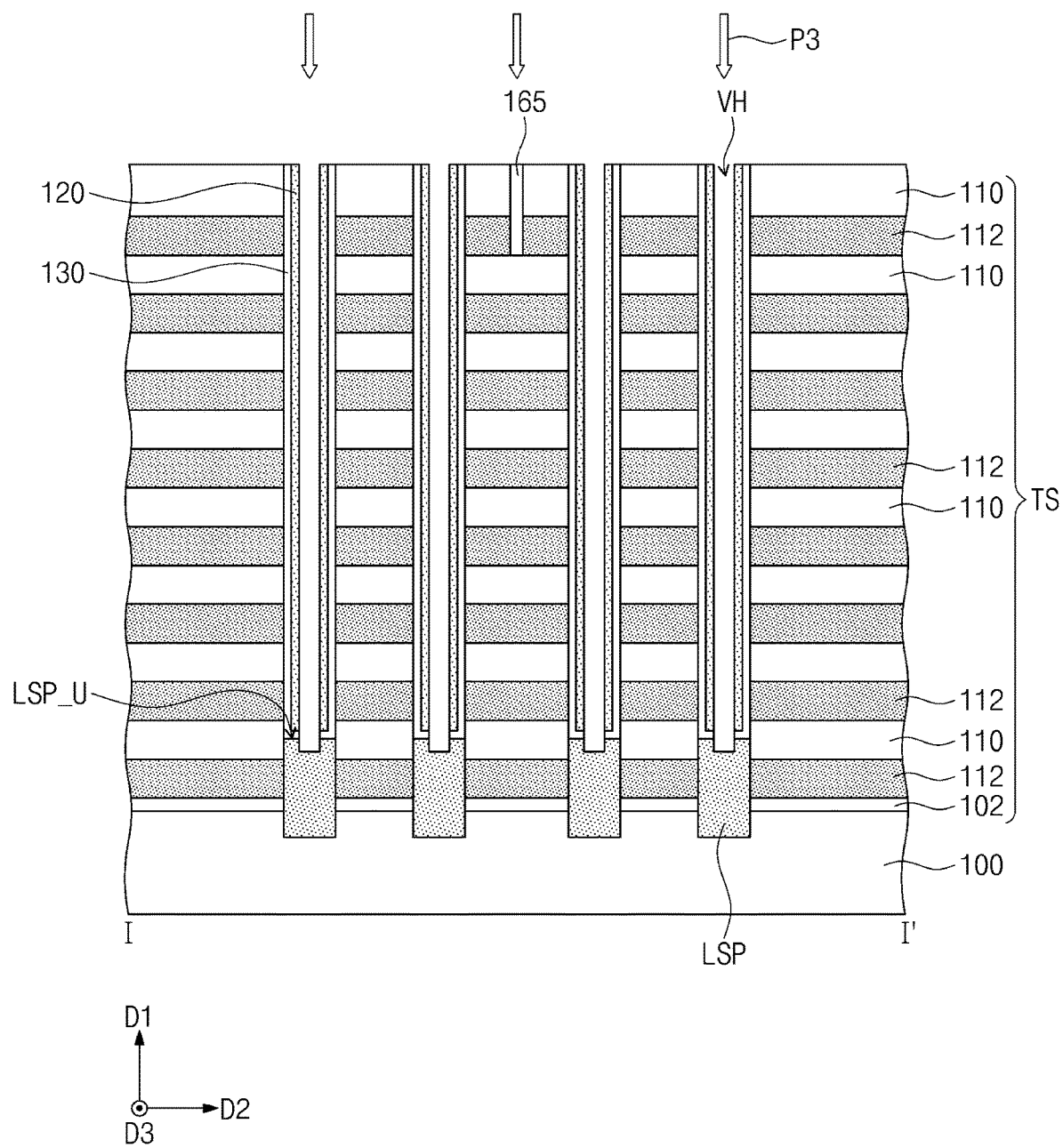

Referring to FIGS. 2 and 10, a data storage pattern 130 may be formed by the anisotropic etching of the data storage layer 132. The data storage pattern 130 may cover the inner surface of the vertical hole VH and may expose the lower semiconductor pattern LSP. An upper portion of the lower semiconductor pattern LSP may be etched by over-etching of the anisotropic etching of the data storage layer 132, and thus a portion of the top surface LSP_U of the lower semiconductor pattern LSP may be recessed.

As described with reference to FIG. 4, the data storage pattern 130 may include a first insulating pattern 130a, a second insulating pattern 130b, and a third insulating pattern 130c, which are sequentially stacked on the inner surface of the vertical hole VH. The first insulating pattern 130a, the second insulating pattern 130b, and the third insulating pattern 130c may be formed by anisotropically etching the first insulating layer, the second insulating layer, and the third insulating layer, respectively.

A portion of the data storage layer 132 located under the sacrificial spacer 120 may not be etched by the anisotropic etching of the data storage layer 132. Thus, the data storage pattern 130 may have a horizontal portion disposed between a bottom surface of the sacrificial spacer 120 and the top surface LSP_U of the lower semiconductor pattern LSP. In more detail, as described with reference to FIG. 5A, each of the first to third insulating patterns 130a, 130b, and 130c may include a horizontal portion HPa, HPb or HPc extending in the second direction D2, and a vertical portion VPa, VPb or VPc extending from the horizontal portion HPa, HPb or HPc in the first direction D1. According to some example embodiments, the second direction D2 may be referred to as a direction toward the inside of the vertical hole VH. The horizontal portion HPa of the first insulating pattern 130a, the horizontal portion HPb of the second insulating pattern 130b, and the horizontal portion HPc of the third insulating pattern 130c may be stacked, e.g., sequentially stacked on the top surface LSP_U of the lower semiconductor pattern LSP in the first direction D1. The vertical portion VPa of the first insulating pattern 130a, the vertical portion VPb of the second insulating pattern 130b, and the vertical portion VPc of the third insulating pattern 130c may be stacked, e.g. sequentially stacked on the inner surface of the vertical hole VH in the second direction D2 (e.g., the direction toward the inside of the vertical hole VH). The horizontal portion of the data storage pattern 130 may include the horizontal portion HPa of the first insulating pattern 130a, the horizontal portion HPb of the second insulating pattern 130b, and the horizontal portion HPc of the third insulating pattern 130c. The horizontal portion of the data storage pattern 130 may be in contact with the top surface LSP_U of the lower semiconductor pattern LSP. For example, the horizontal portion HPa of the first insulating pattern 130a may be in contact with the top surface LSP_U of the lower semiconductor pattern LSP.

A cleaning process P3 may be performed on the thin-layer structure TS after the formation of the data storage pattern 130. The cleaning process P3 may be performed to remove an etch by-product of the first etching process P1 and/or the second etching process P2. The cleaning process P3 may be or include, for example, a wet etching process and may be performed using an etch recipe having an etch selectivity with respect to the second insulating pattern 130b. For example, in the cleaning process P3, an etch rate of the second insulating pattern 130b may be greater than etch rates of the first and third insulating patterns 130a and 130c. The sacrificial spacer 120 may be used as an etch mask during the cleaning process P3. As described with reference to FIGS. 4 and 5A, the horizontal portion HPb of the second insulating pattern 130b may be laterally recessed from the horizontal portions HPa and HPc of the first and third insulating patterns 130a and 130c in the cleaning process P3. For example, the horizontal portion HPa of the first insulating pattern 130a and the horizontal portion HPc of the third insulating pattern 130c may protrude beyond, e.g., extend further than, the sidewall SSb of the horizontal portion HPb of the second insulating pattern 130b in the second direction D2. For example, the horizontal portion HPa of the first insulating pattern 130a and the horizontal portion HPc of the third insulating pattern 130c may protrude beyond, e.g. extend further than, the sidewall SSb of the horizontal portion HPb of the second insulating pattern 130b into the inside of the vertical hole VH. In some example embodiments, the first protrusion length PL1 of the horizontal portion HPa of the first insulating pattern 130a may be substantially equal to the second protrusion length PL2 of the horizontal portion HPc of the third insulating pattern 130c.

In some example embodiments, a portion of the horizontal portion HPc of the third insulating pattern 130c may be lost (e.g. etched) by the cleaning process P3. Thus, as described with reference to FIGS. 4 and 5B, the second protrusion length PL2 of the horizontal portion HPc of the third insulating pattern 130c may be less than the first protrusion length PL1 of the horizontal portion HPa of the first insulating pattern 130a. For example, the horizontal portion HPa of the first insulating pattern 130a may protrude more than the horizontal portion HPc of the third insulating pattern 130c, from the sidewall SSb of the horizontal portion HPb of the second insulating pattern 130b toward the inside of the vertical hole VH.

In some example embodiments, since the cleaning process P3 is performed by the wet etching process, the horizontal portions HPa, HPb, and HPc of the first to third insulating patterns 130a, 130b and 130c may have rounded sidewalls, as described with reference to FIGS. 4 and 5C. For example, the horizontal portions HPa, HPb, and Hpc of the first to third insulating patterns 130a, 130b, and 130c may have rounded sidewalls depending on a chemistry of the cleaning process P3. For example, the sidewall SSb of the horizontal portion HPb of the second insulating pattern 130b may include a concave surface recessed toward the inside of the second insulating pattern 130b, and the sidewall SSc of the horizontal portion HPc of the third insulating pattern 130c may include a convex surface protruding toward the outside of the third insulating pattern 130c. At least a portion of the sidewall SSa of the horizontal portion HPa of the first insulating pattern 130a may include a convex surface protruding toward the outside of the first insulating pattern 130a.

In some example embodiments, the horizontal portions HPa, HPb, and HPc of the first to third insulating patterns 130a, 130b, and 130c may have inclined sidewalls by the cleaning process P3. For example, the horizontal portions HPa, HPb, and Hpc of the first to third insulating patterns 130a, 130b, and 130c may have inclined sidewalls depending on a chemistry of the cleaning process P3. For example, as described with reference to FIGS. 4 and 5D, the sidewall SSa of the horizontal portion HPa of the first insulating pattern 130a may include the first inclined surface S1, and the sidewall SSb of the horizontal portion HPb of the second insulating pattern 130b may include the second inclined surface S2. The second inclined surface S2 may be inclined in the second direction D2 from the normal line 100a, and the first inclined surface S1 may be inclined in an opposite direction to the second direction D2 from the normal line 100a. The sidewall SSc of the horizontal portion HPc of the third insulating pattern 130c may include the third inclined surface S3, and the third inclined surface S3 may be inclined in the second direction D2 from the normal line 100a. The second inclined surface S2 may be aligned with the third inclined surface S3, and the first inclined surface S1 may be offset from the second inclined surface S2 in the second direction D2. For example, as described with reference to FIGS. 4 and 5E, the third inclined surface S3 may be offset from the second inclined surface S2 in the second direction D2, and the bottom surface BSS of the horizontal portion HPc of the third insulating pattern 130c may be disposed between the second inclined surface S2 and the third inclined surface S3. The first inclined surface S1 may be offset from the second inclined surface S2 in the second direction D2, and the top surface TSS of the horizontal portion HPa of the first insulating pattern 130a may be disposed between the first inclined surface S1 and the second inclined surface S2. For example, as described with reference to FIGS. 4 and 5F, the sidewall SSa of the horizontal portion HPa of the first insulating pattern 130a may include the first inclined surface S1, and the first inclined surface S1 may be inclined in an opposite direction to the second direction D2 from the normal line 100a. Alternatively or additionally, the first inclined surface S1 may be a curved surface which is convex toward the outside of the horizontal portion HPa of the first insulating pattern 130a. The sidewall SSc of the horizontal portion HPc of the third insulating pattern 130c may be offset from the sidewall SSb of the horizontal portion HPb of the second insulating pattern 130b in the second direction D2, and the bottom surface BSS of the horizontal portion HPc of the third insulating pattern 130c may be disposed between the sidewall SSc of the horizontal portion HPc of the third insulating pattern 130c and the sidewall SSb of the horizontal portion HPb of the second insulating pattern 130b. For example, the horizontal portions HPa, HPb and HPc of the first to third insulating patterns 130a, 130b and 130c may be formed to have the sidewall profiles described with reference to FIGS. 4 and 5G.

If an additional mask spacer is provided on the sacrificial spacer 120 in the vertical hole VH to form the data storage pattern 130, the additional mask spacer may have a non-uniform thickness dispersion on the inner surface of the vertical hole VH. For example, the additional mask spacer may have a thicker portion on one end of the thin-layer structure TS and have a thinner portion on another end of the thin-layer structure TS. Thus, it may be difficult to etch the data storage layer 132 in an etching process for forming the data storage pattern 130.

However, according to the embodiments of inventive concepts, the data storage pattern 130 may be formed by the second etching process P2, and the second protective layer 127 formed in the second etching process P2 may function as an etch mask during the anisotropic etching for forming the data storage pattern 130. Thus, an additional mask spacer may not be required on the sacrificial spacer 120 in the vertical hole VH, and a defect caused by the additional mask spacer may be prevented or reduced in likelihood of occurrence. In addition, the cleaning process P3 may be performed after the formation of the data storage pattern 130, and thus an etch by-product remaining in the vertical hole VH may be partially or wholly removed. As a result, the processes of manufacturing the 3D semiconductor memory device may be simplified, and it is possible to minimize or reduce the likelihood of or reduce the amount of defects which may occur in the processes of manufacturing the 3D semiconductor memory device.

Figure 11:
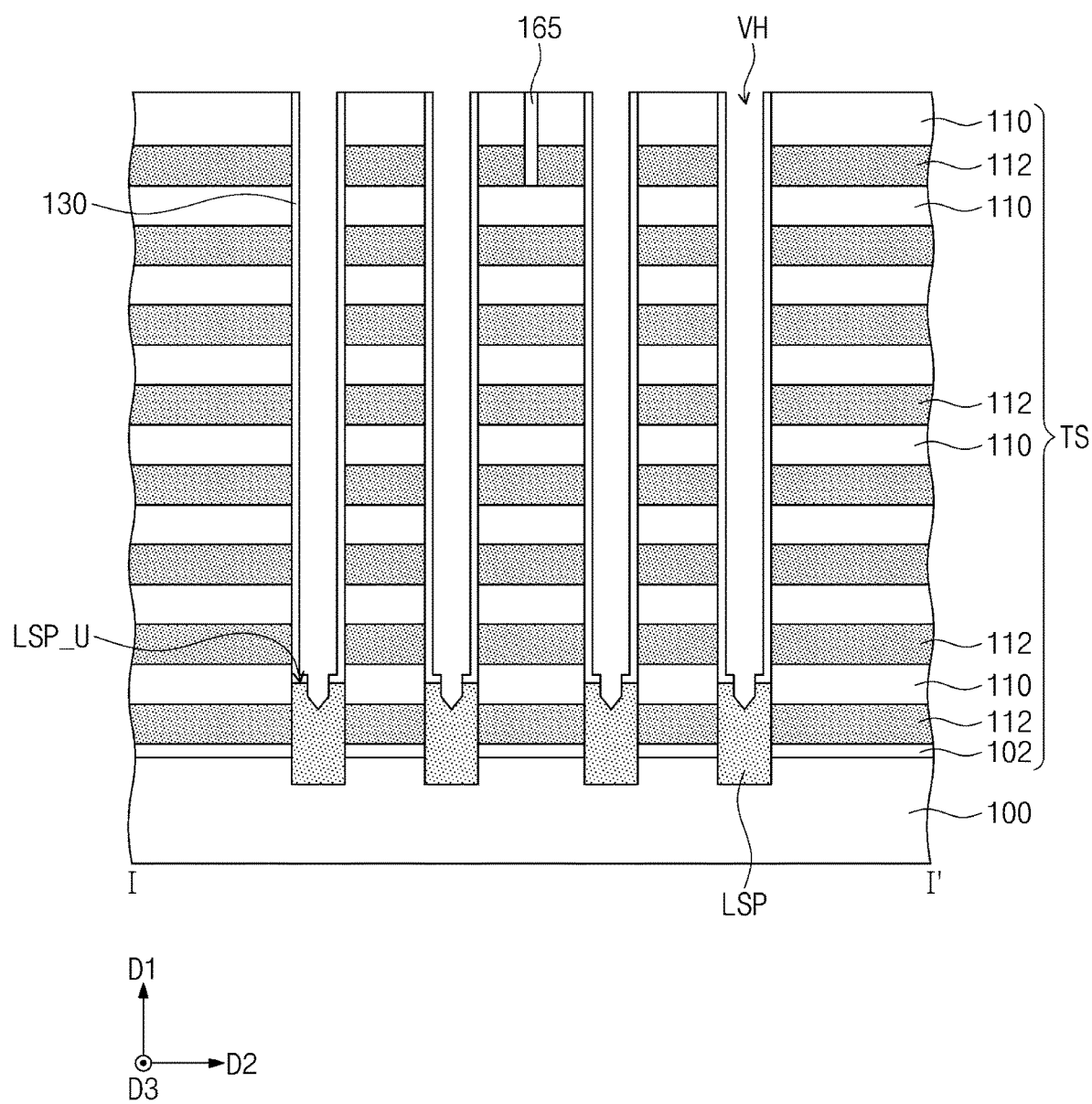

Referring to FIGS. 2 and 11, the sacrificial spacer 120 may be removed. The sacrificial spacer 120 may be removed by an etching process such as an anisotropic and/or isotropic etching process, and the sacrificial spacer 120 may be selectively etched during the etching process. The data storage pattern 130 may be exposed by the etching process, and an upper portion of the lower semiconductor pattern LSP may be over-etched by the etching process. Thus, the lower semiconductor pattern LSP may have an upper recess region formed by the over-etching of the upper portion thereof.

Figure 12:
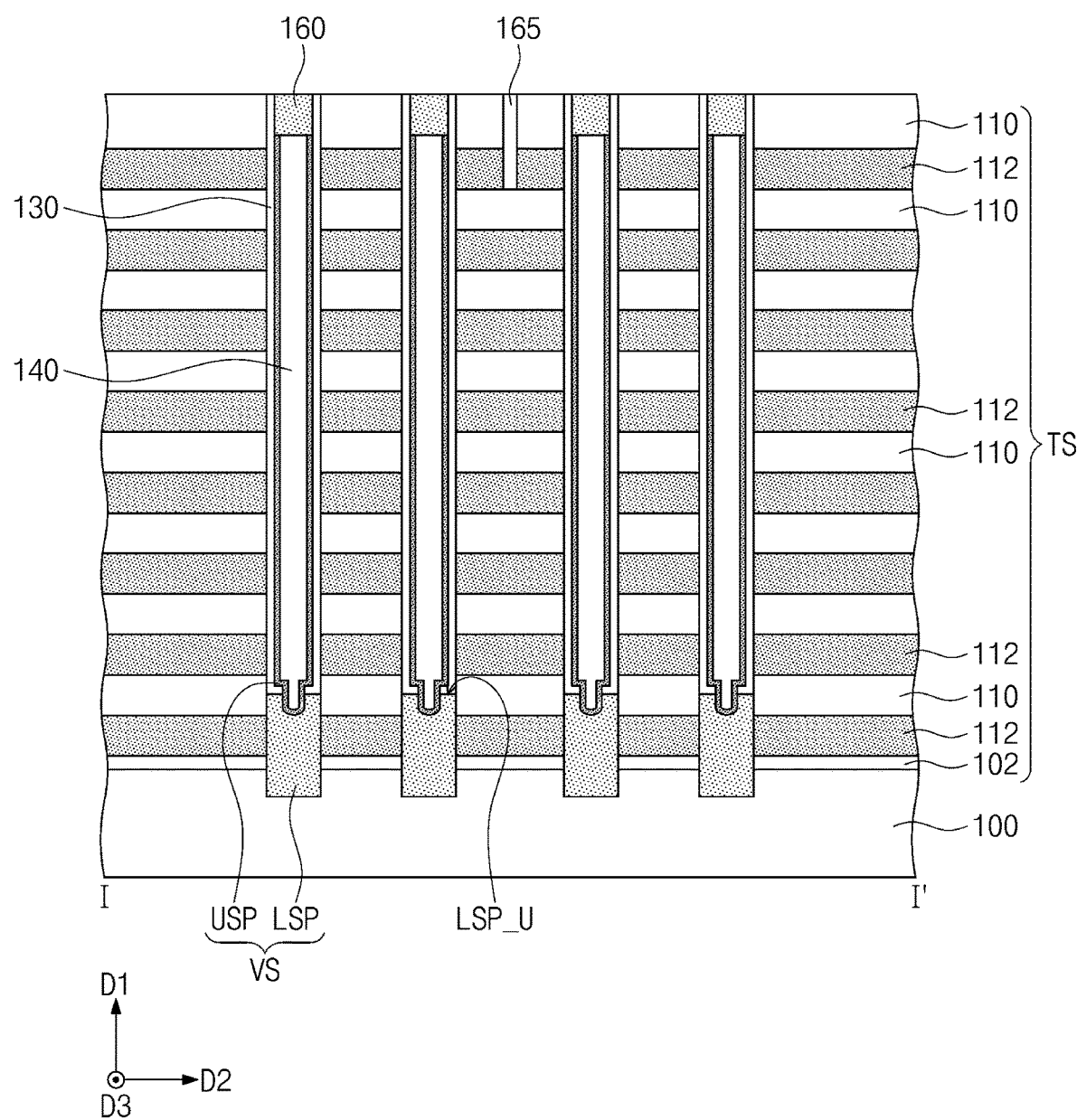

Referring to FIGS. 2 and 12, an upper semiconductor pattern USP may be formed in the vertical hole VH. The upper semiconductor pattern USP may be formed on the data storage pattern 130 and may partially fill the vertical hole VH. The upper semiconductor pattern USP may cover the inner surface of the vertical hole VH with a substantially uniform thickness and may be in contact with the lower semiconductor pattern LSP exposed by the data storage pattern 130. The upper semiconductor pattern USP may partially fill the upper recess region of the lower semiconductor pattern LSP. A filling insulation pattern 140 may be formed to fill a remaining region of the vertical hole VH. The filling insulation pattern 140 may fill a remaining region of the upper recess region of the lower semiconductor pattern LSP. The formation of the upper semiconductor pattern USP and the filling insulation pattern 140 may include sequentially forming a semiconductor layer (not shown) and a filling insulation layer (not shown) filling the vertical hole VH on the thin-layer structure TS, and planarizing, e.g. planarizing with a Chemical Mechanical Planarization (CMP) process, the filling insulation layer and the semiconductor layer until a top surface of the thin-layer structure TS is exposed. The semiconductor layer may include a semiconductor material (e.g., poly-crystalline silicon, single-crystalline silicon, and/or amorphous silicon)

formed using an ALD method and/or a CVD method, and the filling insulation layer may include an insulating material, e.g. a silicon oxide layer, formed using a spin-on-glass (SOG) method. The upper semiconductor pattern USP and the filling insulation pattern 140 may be locally formed in the vertical hole VH by the planarization process. The upper semiconductor pattern USP and the lower semiconductor pattern LSP may constitute a vertical semiconductor pattern VS.

A conductive pad 160 may be formed to cover the topmost surface of the upper semiconductor pattern USP and a top surface of the filling insulation pattern 140. The formation of the conductive pad 160 may include recessing the upper semiconductor pattern USP and the filling insulation pattern 140 to form an empty region in the vertical hole VH, and forming a conductive material filling the empty region. The conductive pad 160 may be locally formed in the vertical hole VH and may be doped, e.g. implanted, with dopants of which a conductivity type is different from that of the upper semiconductor pattern USP.

Figure 13:
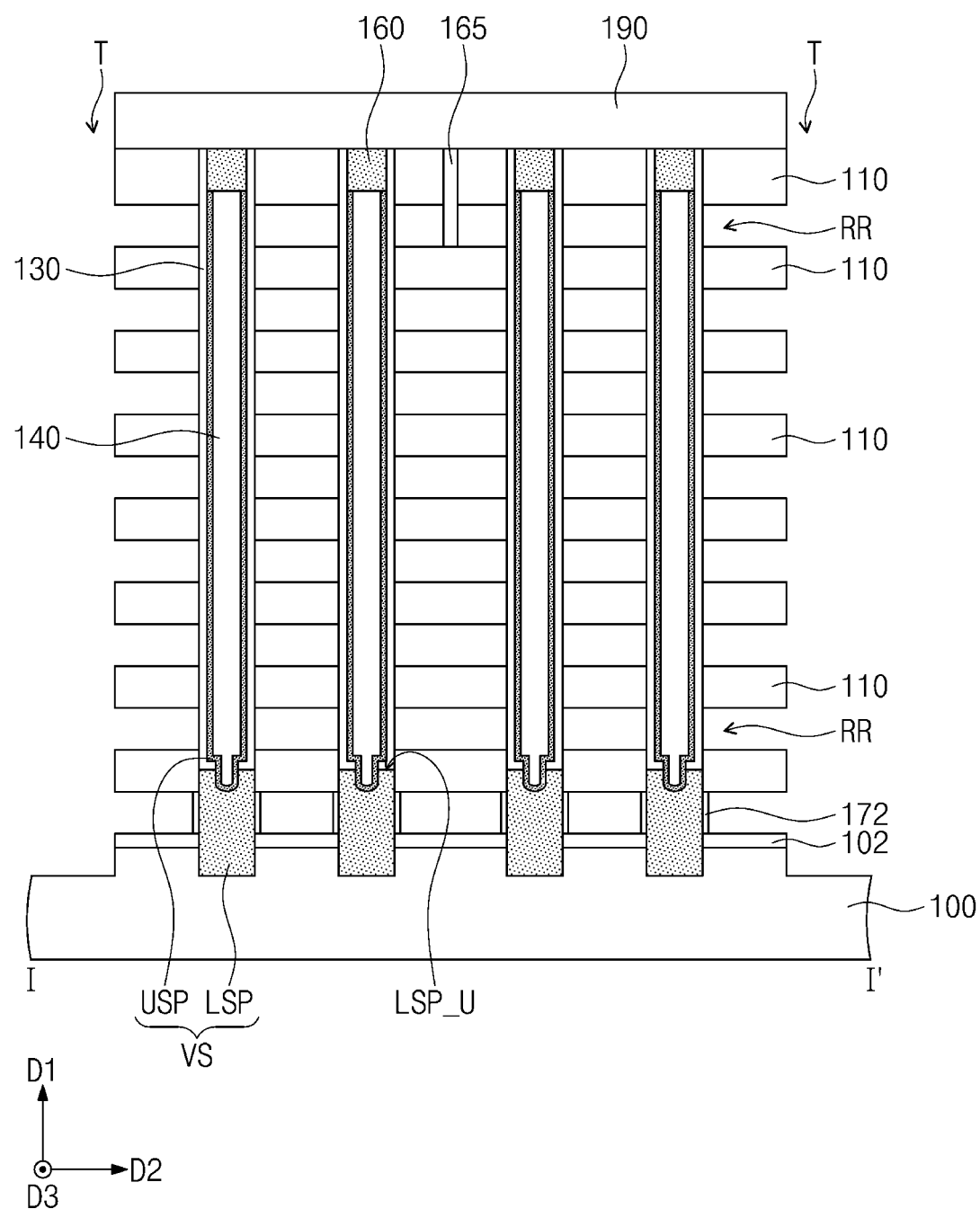

Referring to FIGS. 2 and 13, a capping insulating layer 190 may be formed on the thin-layer structure TS to cover a top surface of the conductive pad 160. The capping insulating layer 190 may include an insulating material (e.g., silicon oxide).

Trenches T may be formed to penetrate the capping insulating layer 190 and the thin-layer structure TS. The trenches T may expose the substrate 100. The trenches T may extend in the third direction D3 and may be spaced apart from each other in the second direction D2. The formation of the trenches T may include forming a mask pattern defining the trenches T on the capping insulating layer 190, and etching, e.g. anisotropically etching, the capping insulating layer 190 and the thin-layer structure TS using the mask pattern as an etch mask. An upper portion of the substrate 100 under the trenches T may be recessed by the etching process for forming the trenches T. The trenches T may be horizontally spaced apart from the vertical semiconductor patterns VS and may expose sidewalls of the sacrificial layers 112 and the insulating layers 110.

The sacrificial layers 112 exposed by the trenches T may be removed to form recess regions RR between the insulating layers 110. The lowermost one of the recess regions RR may laterally extend between the lower insulating layer 102 and the lowermost one of the insulating layers 110. The lowermost recess region RR may expose a sidewall of the lower semiconductor pattern LSP. The others of the recess regions RR may laterally extend between the insulating layers 110 and may expose portions of a sidewall of the data storage pattern 130.

A gate dielectric pattern 172 may be formed in the lowermost recess region RR. The formation of the gate dielectric pattern 172 may include performing an oxidation process, such as a thermal oxidation process, to oxidize the sidewall of the lower semiconductor pattern LSP exposed by the lowermost recess region RR. For example, the gate dielectric pattern 172 may include silicon oxide.

Figure 14:
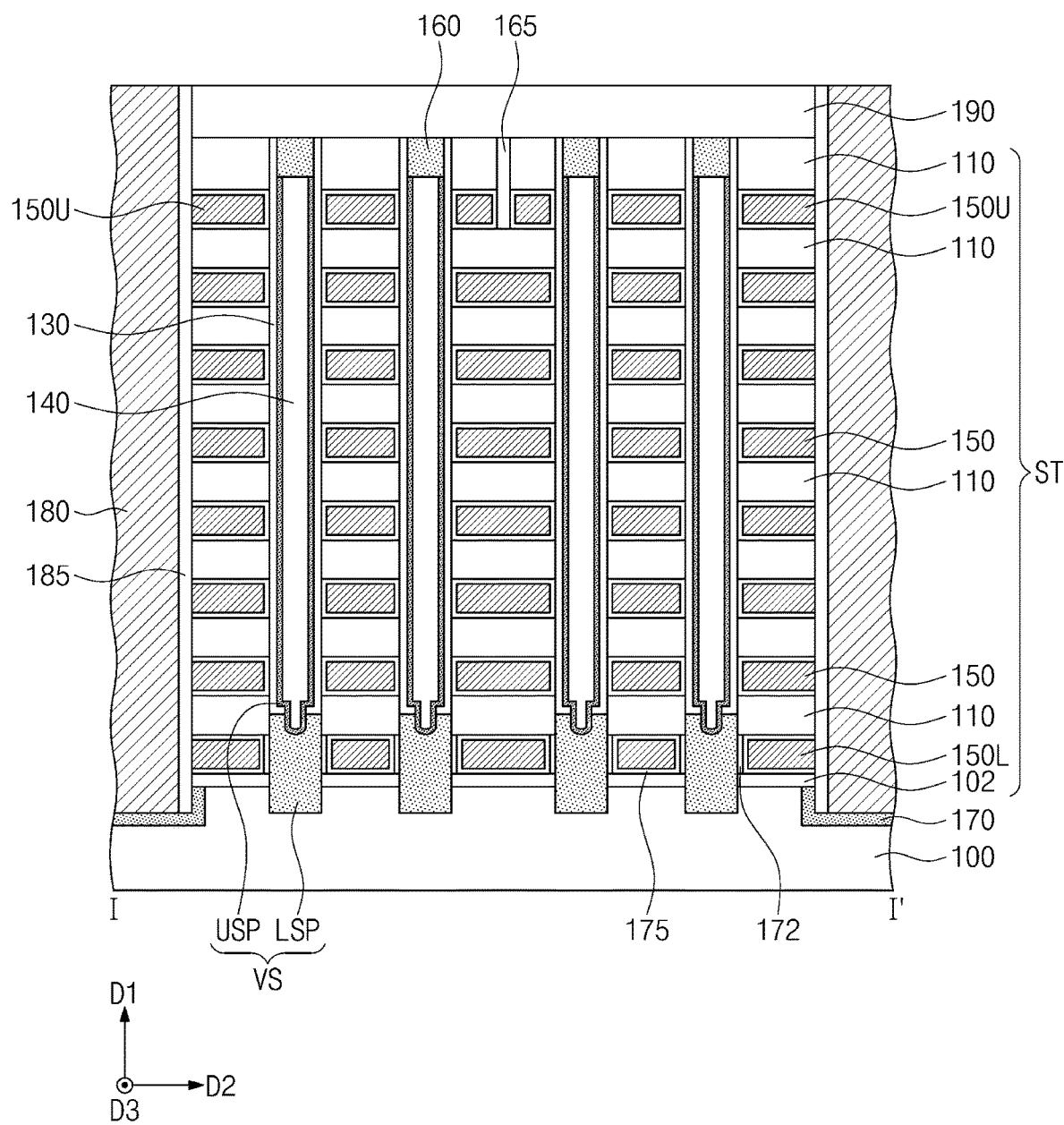

Referring to FIGS. 2 and 14, horizontal insulators 175 and gate electrodes 150L, 150 and 150U may be formed in the recess regions RR. Each of the horizontal insulators 175 may be formed to fill a portion of each of the recess regions RR, and each of the gate electrodes 150L, 150 and 150U may be formed to fill a remaining portion of each of the recess regions RR. The formation of the horizontal insulators 175 and the gate electrodes 150L, 150 and 150U may include sequentially forming a horizontal insulating layer and a gate electrode layer which fill the recess regions RR, and removing the horizontal insulating layer and the gate electrode layer from the trenches T to locally form the horizontal insulators 175 and the gate electrodes 150L, 150 and 150U in the recess regions RR. The horizontal insulating layer may include a single thin layer or a plurality of thin layers and may include a blocking insulating layer of a charge trap-type flash memory transistor. In some example embodiments, the formation of the gate electrode layer may include sequentially depositing a barrier metal layer and a metal layer. For example, the barrier metal layer may be formed of a metal nitride layer such as TiN, TaN, and/or WN, and the metal layer may be formed of a metal material such as W, Al, Ti, Ta, Co, and/or Cu.

Each of the horizontal insulators 175 may be in contact with the data storage pattern 130 or the gate dielectric pattern 172. The lower insulating layer 102, the gate electrodes 150L, 150 and 150U and the insulating layers 110 disposed between the gate electrodes 150L, 150 and 150U may constitute an electrode structure ST.

Common source regions 170 may be formed in the substrate 100. The common source regions 170 may be formed by performing an ion implantation process on the substrate 100 under the trenches T. The common source regions 170 may have a different conductivity type from that of the lower semiconductor pattern LSP. The common source regions 170 may be spaced apart from each other in the second direction D2 with the electrode structure ST interposed therebetween. Common source plugs 180 may be formed in the trenches T, respectively, and may be connected to the common source regions 170, respectively. Sidewall insulating spacers 185 may be formed in the trenches T, respectively, and each of the sidewall insulating spacers 185 may be disposed between the electrode structure ST and each of the common source plugs 180. For example, a sidewall insulating spacer layer with a substantially uniform thickness may be formed to cover inner surfaces of the trenches T, and an anisotropic etching process may be performed on the sidewall insulating spacer layer to form the sidewall insulating spacers 185. For example, a conductive layer may be formed to fill remaining portions of the trenches T, and the conductive layer may be planarized until a top surface of the capping insulating layer 190 is exposed, thereby forming the common source plugs 180.

Referring again to FIGS. 2 and 3, a first contact 192 may be formed in the capping insulating layer 190 so as to be connected to the conductive pad 160. An interlayer insulating layer 195 may be formed on the capping insulating layer 190 and may cover top surfaces of the common source plugs 180. A second contact 197 may be formed in the interlayer insulating layer 195 so as to be connected to the first contact 192. Bit lines 200 may be formed on the interlayer insulating layer 195. The vertical semiconductor patterns VS may include a dummy vertical semiconductor pattern DVS which is not connected to the first contact 192 or the second contact 197. Except for the dummy vertical semiconductor pattern DVS, each of the other vertical semiconductor patterns VS may be electrically connected to a corresponding one of the bit lines 200 through the first and second contacts 192 and 197.

According to the embodiments of inventive concepts, the processes of manufacturing the 3D semiconductor memory device may be simplified, and it is possible to minimize or reduce the likelihood or reduce the occurrence of defects which may occur in the processes of manufacturing the 3D semiconductor memory device.

While inventive concepts have been described with reference to example embodiments, it will be apparent to those of ordinary skill in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A three-dimensional (3D) semiconductor memory device comprising:
   a substrate;
   an electrode structure on the substrate, the electrode structure including gate electrodes stacked in a first direction, the first direction perpendicular to a top surface of the substrate;
   a vertical semiconductor pattern penetrating the electrode structure and connecting to the substrate; and
   a data storage pattern between the electrode structure and the vertical semiconductor pattern,
   wherein the data storage pattern includes a first insulating pattern, a second insulating pattern, and a third insulating pattern, the first through third insulating patterns sequentially stacked,
   each of the first to third insulating patterns includes a horizontal portion extending in a second direction, the second direction parallel to the top surface of the substrate,
   the horizontal portion of the first insulating pattern, the horizontal portion of the second insulating pattern, and the horizontal portion of the third insulating pattern are sequentially stacked in the first direction, and
   in the second direction, at least one of the horizontal portion of the first insulating pattern or the horizontal portion of the third insulating pattern protrudes beyond a sidewall of the horizontal portion of the second insulating pattern.

2. The 3D semiconductor memory device of claim 1, wherein in the first direction, each of the first to third insulating patterns includes a vertical portion extending from the horizontal portion, and
   the vertical portion of the second insulating pattern is between the vertical portion of the first insulating pattern and the vertical portion of the third insulating pattern.

3. The 3D semiconductor memory device of claim 2, wherein the vertical portion of the first insulating pattern is between the electrode structure and the vertical portion of the second insulating pattern, and
   the vertical portion of the third insulating pattern is disposed between the vertical semiconductor pattern and the vertical portion of the second insulating pattern.

4. The 3D semiconductor memory device of claim 2, wherein the vertical semiconductor pattern comprises:
   a lower semiconductor pattern penetrating a lower portion of the electrode structure and connected to the substrate; and
   an upper semiconductor pattern penetrating an upper portion of the electrode structure and connected to the lower semiconductor pattern,
   wherein in the first direction, the horizontal portion of the first insulating pattern, the horizontal portion of the second insulating pattern, and the horizontal portion of the third insulating pattern are sequentially stacked on a top surface of the lower semiconductor pattern.

5. The 3D semiconductor memory device of claim 1, wherein the horizontal portion of the second insulating pattern is disposed between the horizontal portion of the first insulating pattern and the horizontal portion of the third insulating pattern,
   in the second direction each of the horizontal portion of the first insulating pattern and the horizontal portion of the third insulating pattern protrudes beyond the sidewall of the horizontal portion of the second insulating pattern, and
   the vertical semiconductor pattern extends between the horizontal portion of the first insulating pattern and the horizontal portion of the third insulating pattern and contacts the sidewall of the horizontal portion of the second insulating pattern.

6. The 3D semiconductor memory device of claim 1, wherein the sidewall of the horizontal portion of the second insulating pattern includes a concave surface having a recess toward an inside of the second insulating pattern.

7. The 3D semiconductor memory device of claim 6, wherein the horizontal portion of the first insulating pattern includes a convex sidewall protruding toward an outside of the first insulating pattern, and
   in the second direction a lower edge of the sidewall of the horizontal portion of the first insulating pattern protrudes beyond an upper edge of the sidewall of the horizontal portion of the first insulating pattern.

8. The 3D semiconductor memory device of claim 1, wherein the sidewall of the horizontal portion of the second insulating pattern includes an inclined surface.

9. The 3D semiconductor memory device of claim 1, wherein among the horizontal portion of the first insulating pattern and the horizontal portion of the third insulating pattern, the horizontal portion of the first insulating pattern is closer to the top surface of the substrate,
   wherein a sidewall of the horizontal portion of the first insulating pattern includes a first inclined surface,
   the sidewall of the horizontal portion of the second insulating pattern includes a second inclined surface, and
   from a normal line perpendicular to the top surface of the substrate, the first inclined surface and the second inclined surface are inclined in opposite directions to each other.

10. The 3D semiconductor memory device of claim 9, wherein a sidewall of the horizontal portion of the third insulating pattern includes a third inclined surface, and
    the third inclined surface and the second inclined surface are inclined in the same direction from the normal line.

11. The 3D semiconductor memory device of claim 1, wherein, among the horizontal portion of the first insulating pattern and the horizontal portion of the third insulating pattern, the horizontal portion of the first insulating pattern is closer to the top surface of the substrate,
    the horizontal portion of the second insulating pattern is between the horizontal portion of the first insulating pattern and the horizontal portion of the third insulating pattern,
    in the second direction, each of the horizontal portion of the first insulating pattern and the horizontal portion of the third insulating pattern protrudes beyond the sidewall of the horizontal portion of the second insulating pattern, and
    the horizontal portion of the first insulating pattern protrudes more than the horizontal portion of the third insulating pattern.

12. The 3D semiconductor memory device of claim 1, wherein in the second direction each of the horizontal portion of the first insulating pattern and the horizontal portion of the third insulating pattern protrudes beyond the sidewall of the horizontal portion of the second insulating pattern, a sidewall of the horizontal portion of the first insulating pattern includes an inclined surface, and from a normal line perpendicular to the top surface of the substrate the inclined surface is inclined in an opposite direction to the second direction.

13. The 3D semiconductor memory device of claim 1, wherein the second insulating pattern includes a material having an etch selectivity with respect to the first and third insulating patterns.

14. A three-dimensional (3D) semiconductor memory device comprising:
   a substrate;
   an electrode structure on the substrate, the electrode structure including gate electrodes stacked in a first direction perpendicular to a top surface of the substrate;
   a vertical semiconductor pattern penetrating the electrode structure and connecting to the substrate;
   a first insulating pattern extending in the first direction, the first insulating pattern between the electrode structure and the vertical semiconductor pattern; and
   a second insulating pattern extending in the first direction, the second insulating pattern between the first insulating pattern and the vertical semiconductor pattern,
   wherein each of the first and second insulating patterns includes a horizontal portion extending in a second direction, the second direction parallel to the top surface of the substrate,
   the horizontal portion of the first insulating pattern is between the substrate and the horizontal portion of the second insulating pattern, and
   the horizontal portion of the first insulating pattern protrudes beyond a sidewall of the horizontal portion of the second insulating pattern in the second direction.

15. The 3D semiconductor memory device of claim 14, wherein the second insulating pattern includes a material having an etch selectivity with respect to the first insulating pattern.

16. The 3D semiconductor memory device of claim 14, further comprising:

a third insulating pattern extending in the first direction, the third insulating pattern between the second insulating pattern and the vertical semiconductor pattern, wherein the third insulating pattern includes a horizontal portion extending in the second direction, the horizontal portion of the third insulating pattern is on the horizontal portion of the second insulating pattern, and the horizontal portion of the third insulating pattern protrudes beyond the sidewall of the horizontal portion of the second insulating pattern in the second direction.

17. The 3D semiconductor memory device of claim 16, wherein the horizontal portion of the first insulating pattern has a first protrusion length beginning from the sidewall of the horizontal portion of the second insulating pattern, the horizontal portion of the third insulating pattern has a second protrusion length beginning from the sidewall of the horizontal portion of the second insulating pattern, and the first protrusion length is different from the second protrusion length.

18. The 3D semiconductor memory device of claim 14, wherein the sidewall of the horizontal portion of the second insulating pattern includes a concave surface recessed toward an inside of the second insulating pattern.

19. The 3D semiconductor memory device of claim 14, wherein the sidewall of the horizontal portion of the second insulating pattern includes an inclined surface, and from a normal line perpendicular to the top surface of the substrate the inclined surface is inclined in the second direction.

20. The 3D semiconductor memory device of claim 14, wherein the vertical semiconductor pattern comprises:
   a lower semiconductor pattern penetrating a lower portion of the electrode structure and connecting to the substrate; and
   an upper semiconductor pattern penetrating an upper portion of the electrode structure and connected to the lower semiconductor pattern,
   wherein the horizontal portion of the first insulating pattern is between the lower semiconductor pattern and the horizontal portion of the second insulating pattern.

* * * * *